(12) United States Patent
Kanda et al.

(10) Patent No.: US 7,114,025 B2
(45) Date of Patent: Sep. 26, 2006

(54) SEMICONDUCTOR MEMORY HAVING TEST FUNCTION FOR REFRESH OPERATION

(75) Inventors: Tatsuya Kanda, Kawasaki (JP); Akihiro Funyu, Kawasaki (JP); Takahiko Sato, Kawasaki (JP); Yoshiaki Okuyama, Kawasaki (JP); Jun Ohno, Kawasaki (JP); Hitoshi Ikeda, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 262 days.

(21) Appl. No.: 10/689,486

(22) Filed: Oct. 21, 2003

(65) Prior Publication Data

US 2004/0199717 A1    Oct. 7, 2004

(30) Foreign Application Priority Data

Oct. 31, 2002 (JP) .............................. 2002-317238
Jun. 27, 2003 (JP) .............................. 2003-184380

(51) Int. Cl.
   *G11C 7/00* (2006.01)
   *G06F 13/00* (2006.01)
(52) U.S. Cl. ....................... 711/106; 711/105; 711/167; 365/222
(58) Field of Classification Search ................ None
   See application file for complete search history.

(56) References Cited

U.S. PATENT DOCUMENTS 6,625,079 B1 * 9/2003 Yahata et al. ............... 365/222
6,714,470 B1 * 3/2004 Leung et al. ................ 365/203
6,741,515 B1 * 5/2004 Lazar et al. ................. 365/222
6,757,207 B1 * 6/2004 Lazar .......................... 365/222
6,771,554 B1 * 8/2004 Lazar .......................... 365/222
6,795,363 B1 * 9/2004 Nakashima et al. ........ 365/222
6,842,392 B1 * 1/2005 Mizugaki et al. ........... 365/222
6,851,017 B1 * 2/2005 Horiguchi et al. .......... 711/106

FOREIGN PATENT DOCUMENTS

JP    63-247995    10/1988
JP    7-58589      6/1995

* cited by examiner

Primary Examiner—Mano Padmanabhan
Assistant Examiner—Jasmine Song
(74) Attorney, Agent, or Firm—Arent Fox PLLC

(57) ABSTRACT

A semiconductor memory includes a refresh timer and an arbiter for determining the order of precedence between an access operation and a refresh operation, in order to automatically perform refresh operations inside the memory. A detecting circuit operates in a test mode and outputs a detection signal indicating that the refresh operation is yet to be performed, when a new internal refresh request occurs before the refresh operation is performed. For example, the detection signal is output when the interval of access requests is short and no refresh operation can be inserted between the access operations. That is, in the semiconductor memory in which refresh operations are performed automatically, it is possible to evaluate the minimum interval of supplying access requests. As a result, the evaluation time can be reduced with a reduction in the development period of the semiconductor memory.

10 Claims, 19 Drawing Sheets

SEMICONDUCTOR MEMORY HAVING TEST FUNCTION FOR REFRESH OPERATION

CROSS-REFERENCE TO RELATED APPLICATIONS

This application is based upon and claims the benefit of priority from the prior Japanese Patent Application Nos. 2002-317238 and 2003-184380, each filed on Oct. 31, 2002 and Jun. 27, 2003, the entire contents of which are incorporated herein by reference.

BACKGROUND OF THE INVENTION

1. Field of the Invention

The present invention relates to a technology for testing a semiconductor memory which requires periodic refresh operations to retain data written in its memory cells. In particular, the present invention relates to a technology for testing a semiconductor memory which performs refresh operations automatically inside itself without requiring refresh commands from the exterior.

2. Description of the Related Art

Recently, mobile devices such as a cellular phone have been sophisticated in service facilities, with ever-increasing amounts of data to be handled. Then, work memories to be mounted on the mobile devices require larger capacities accordingly.

Conventionally, the work memories of the mobile devices have used SRAMs which are easy to configure a system with. SRAMs are, however, greater than DRAMs in the number of devices for constituting each single bit of cell, and thus are disadvantageous for larger capacities. On this account, semiconductor memories which have DRAM memory cells and perform refresh operations on the memory cells automatically inside to operate as SRAMs have been developed (pseudo SRAMs).

In the semiconductor memories of this type, the refresh operation time for performing a single refresh operation is included in the read cycle time or write cycle time. Specifically, the first half of a cycle time is allocated for the refresh operation time. The actual read operation or write operation is performed in the second half of the cycle time. Thus, the systems (users) on which the semiconductor memories are mounted need not be aware of the refresh operations in the semiconductor memories. That is, the users can use these semiconductor memories as SRAMs.

Moreover, in the semiconductor memories of this type, the refresh operation time is rendered shorter than the read operation time for the sake of reduced cycle times, as disclosed in Japanese Examined Patent Application Publication No. Hei 7-58589. Specifically, the time for selecting word lines in refresh operation is shorter than the time for selecting the word lines in read operation.

As mentioned above, pseudo SRAMs perform refresh operations automatically without being recognized from the exterior. Meanwhile, data retained in the memory cells might be corrupted if refresh operations are performed improperly. It is therefore necessary to evaluate that refresh operations are performed properly. In particular, detailed evaluations are required of the circuit operation when a conflict occurs between a request for a read operation or write operation which is supplied from the exterior and a request for a refresh operation which occurs inside the chip.

SUMMARY OF THE INVENTION

It is an object of the present invention to evaluate the internal state of a chip in order to perform refresh operations reliably.

Another object of the present invention is to perform refresh operations reliably in a semiconductor memory that automatically performs refresh operations inside the chip.

Another object of the present invention is to run a simple test for the actual value of an access cycle when a conflict occurs between an access operation and a refresh operation, thereby reducing the test cost.

According to one of the aspects of the semiconductor memory of the present invention, a memory core has a plurality of memory cells, a bit line connected to the memory cells, and a sense amplifier connected to the bit line. A command control circuit outputs an access request signal for accessing the memory cells in response to an access request supplied through a command terminal. An operation control circuit makes the memory core perform an access operation in response to the access control signal.

A refresh timer generates an internal refresh request at predetermined cycles. An arbiter outputs an access control signal and then a refresh control signal when the access request has precedence over the internal refresh request. Moreover, the arbiter outputs the refresh control signal and then the access control signal when the internal refresh request has precedence over the access request. As above, the semiconductor memory automatically performs refresh operations in accordance with refresh requests it generates, without being recognized from the exterior.

A detecting circuit outputs a detection signal indicating that the refresh operation is yet to be performed when a new internal refresh request occurs before the refresh operation corresponding to the internal refresh request is performed, the detecting circuit operating in a test mode. For example, the detection signal is output when the interval of access requests is short and thus no refresh operation can be inserted between the access operations. That is, the minimum interval of supplying access requests can be evaluated. As a result, it is possible to reduce the evaluation time with a reduction in the development period of the semiconductor memory. That is, the development cost can be cut down. Otherwise, in semiconductor memories under mass production, defects which have occurred due to variations of manufacturing conditions and the like can be analyzed promptly, allowing the minimization of the low yield period.

According to another aspect of the semiconductor memory of the present invention, the detection signal detected by the detecting circuit is output to the exterior of the semiconductor memory through an external terminal. Therefore, the minimum interval of supplying access requests can be evaluated precisely, for example, by detecting the detection signal with an evaluation system for evaluating the semiconductor memory.

According to another aspect of the semiconductor memory of the present invention, a tristate output buffer outputs read data from the memory cells to a data terminal. An output mask circuit controls the tristate output buffer in the test mode so as to prohibit output of the read data to the data terminal in response to the detection signal and set the data terminal to a high impedance state. Thus, an evaluation system connected to the semiconductor memory can detect the detection signal by measuring the high impedance state of the data terminal. For example, it can be easily detected that the detection signal has occurred by using an LSI tester as the evaluation system and conducting a pass/fail evaluation through use of a program for evaluating access time. That is, the minimum interval of supplying access requests can be evaluated easily. Besides, using the data terminal as the external terminal allows the data terminal to be also used as a test terminal. This eliminates the need for forming new terminals, thereby preventing an increase in chip size.

According to another aspect of the semiconductor memory of the present invention, a refresh selecting circuit outputs a test refresh request supplied through an external test terminal, instead of the internal refresh request, to the arbiter in the test mode. Here, the internal refresh request output from the refresh timer is masked. Therefore, it is possible to supply refresh requests having desired timings from the exterior of the semiconductor memory. Consequently, signals having timings which are impossible in the normal operations of the semiconductor memory can be generated for detailed and efficient tests.

According to another aspect of the semiconductor memory of the present invention, in the test mode, the refresh timer receives a refresh adjustment signal for changing the cycle of generation of the refresh request. Therefore, it is possible to generate refresh requests having desired timings inside the semiconductor memory chip by using circuits that operate in normal operation. The refresh characteristics can thus be evaluated under the same conditions as those in the actual circuit operations of the semiconductor memory.

According to another aspect of the semiconductor memory of the present invention, a memory core has a plurality of memory cells, a bit line connected to the memory cells, and a sense amplifier connected to the bit line. A command control circuit outputs an access request signal for accessing the memory cells in response to an access request supplied through a command terminal. A refresh timer generates an internal refresh request at predetermined cycles.

An arbiter determines the order of precedence between an access operation corresponding to the access request and a refresh operation corresponding to the internal refresh request when a conflict occurs between the access request and the internal refresh request. An interruption circuit outputs a refresh interrupting signal upon receiving a next access request within a predetermined period from the completion of the access operation performed with precedence over the refresh operation.

An operation control circuit starts a refresh operation of the memory core when the arbiter determines to give precedence to the internal refresh request. The semiconductor memory thus performs refresh operations automatically in accordance with refresh requests it generates, without being recognized from the exterior. The operation control circuit interrupts the refresh operation in execution upon receiving the refresh interrupting signal. For example, the refresh operation is interrupted when the interval of access requests is short and thus no refresh operation can be completed between the access operations. The operation control circuit makes the memory core perform the access operation when the arbiter determines to give precedence to the access request.

An interruption detecting circuit operates in a test mode and outputs a detecting signal when a refresh operation is interrupted in response to the refresh interrupting signal. The minimum interval of supplying access requests can be evaluated by detecting, from the output of the detecting signal, that the refresh operation started between access operations cannot be completed. As a result, it is possible to reduce the evaluation time with a reduction in the development period of the semiconductor memory. That is, the development cost can be cut down. Otherwise, in semiconductor memories under mass production, defects which have occurred due to variations of manufacturing conditions and the like can be analyzed promptly. This can minimize the low yield period.

According to another aspect of the semiconductor memory of the present invention, the semiconductor memory has a word line connected to the memory cells. The predetermined period to be set by the interruption circuit is a period from when the operation control circuit receives an instruction to start a refresh operation from the arbiter until when activation of the word line is started for the refresh operation. Since the interruption of the refresh operation is judged before the activation of the word line, the data in the memory cells to be refreshed is prevented from being corrupted.

BRIEF DESCRIPTION OF THE DRAWINGS

The nature, principle, and utility of the invention will become more apparent from the following detailed description when read in conjunction with the accompanying drawings in which like parts are designated by identical reference numbers, in which.

DESCRIPTION OF THE PREFERRED EMBODIMENTS

Figure 1:
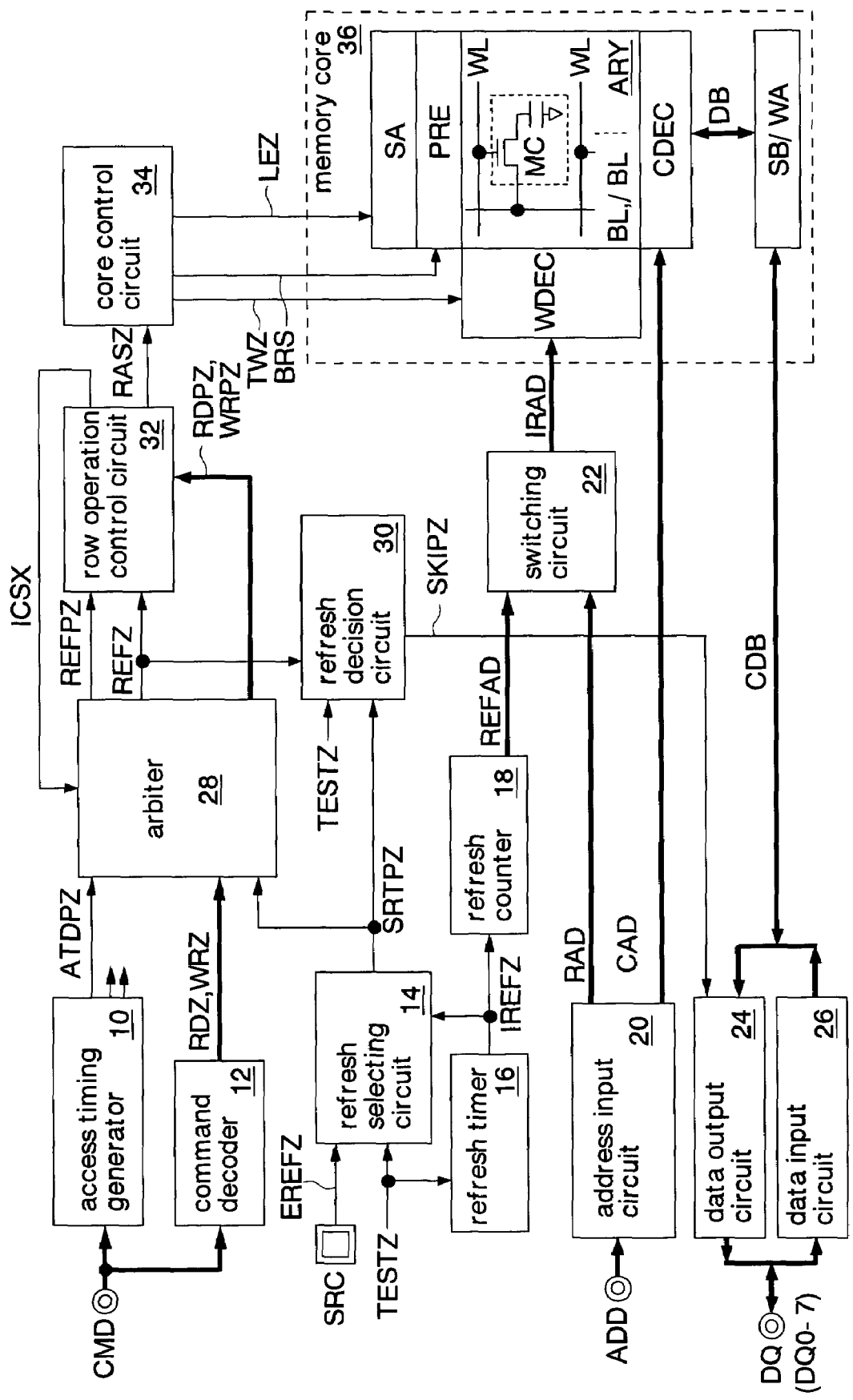
FIG. 1 is a block diagram showing a first embodiment of the semiconductor memory of the present invention.

Hereinafter, embodiments of the present invention will be described with reference to the drawings. In the drawings, each thick line represents a signal line that consists of a plurality of bits. Double circles in the drawings represent external terminals. The double square in the drawings represents a test pad. The test pad is not connected to any of the external terminals (lead frame etc.) of the product to be shipped. The test pad is connected with a prober in a probe test, for example, and receives test patterns. Signals with a leading "/" and signals ending in "X" are of negative logic. Signals ending in "Z" are of positive logic.

FIG. 1 shows a first embodiment of the semiconductor memory of the present invention. This semiconductor memory is formed as a pseudo SRAM which has DRAM memory cells (dynamic memory cells) and an SRAM interface. The pseudo SRAM performs periodic refresh operations inside the chip without receiving refresh commands from the exterior, thereby retaining data written in its memory cells. This pseudo SRAM is used as a work memory to be mounted on a cellular phone, for example.

The pseudo SRAM has an access timing generator 10, a command decoder 12, a refresh selecting circuit 14, a refresh timer 16, a refresh counter 18, an address input circuit 20, a switching circuit 22, a data output circuit 24, a data input circuit 26, an arbiter 28, a refresh decision circuit 30, a row operation control circuit 32, a core control circuit 34, and a memory core 36.

The access timing generator 10 receives command signals CMD (including a chip enable signal /CE, an output enable signal /OE, and a write enable signal /WE) from the exterior through a command terminal CMD, and outputs an access timing signal ATDPZ and the like for performing a read operation or a write operation.

The command decoder 12 decodes the command signals CMD, and outputs a read request signal RDZ for performing a read operation or a write request signal WRZ for performing a write operation.

The refresh selecting circuit 14 outputs an internal refresh request IREFZ, which is output from the refresh timer 16, as a refresh timing signal SRTPZ in normal operation mode. The refresh selecting circuit 14 outputs a test refresh signal EREFZ, which is supplied from the exterior of the pseudo SRAM through an external test terminal SRC, as the refresh timing signal SRTPZ in test mode. That is, during test mode, the internal refresh request signal IREFZ output from the refresh timer 16 is masked and the test refresh request signal EREFZ is output as the refresh timing signal SRTPZ instead of the internal refresh request signal IREFZ.

Incidentally, the pseudo SRAM shifts from normal operation mode to test mode when it receives a plurality of command signals CMD in a combination that is unused in normal operation. In test mode, the pseudo SRAM maintains a test signal TESTZ at high level.

The refresh timer 16 outputs the internal refresh request signal IREFZ at predetermined cycles. The internal refresh request signal IREFZ is generated in cycles in which memory cells MC can be refreshed sequentially without losing the data retained in the memory cells MC. For example, the cycle of generation of the internal refresh request signal IREFZ is set so that all the memory cells MC are refreshed once within 300 ms. More specifically, given that the number of word lines WL to be selected sequentially by respective refresh requests is 8 k, the internal refresh request signal IREFZ is generated at every 36 to 37 μs. The refresh timer 16 is composed of, for example, a ring oscillator having an oscillation cycle of 1 μs and a divider for generating the internal refresh request signal IREFZ from the output of the ring oscillator.

The refresh counter 18 counts in response to the internal refresh request signal IREFZ, thereby generating a refresh address signal REFAD successively.

The address input circuit 20 receives an address signal ADD through an address terminal ADD, and outputs the received signal as a row address signal RAD (upper address) and a column address signal CAD (lower address). Note that the pseudo SRAM is a memory of address non-multiplex type which receives the upper address and the lower address simultaneously.

The switching circuit 22 outputs the refresh address signal REFAD as an internal row address signal IRAD in performing a refresh operation, and outputs the row address signal RAD as the internal row address signal IRAD in performing a read operation or a write operation.

The data output circuit 24 receives read data from the memory cells MC through a common data bus CDB, and outputs the received data to data terminals DQ (DQ0–7). Besides, the data output circuit 24 sets the data terminals DQ0–7 to a high impedance state when it receives a skip signal SKIPZ (detection signal), which is output from the refresh decision circuit 28, in test mode.

The data input circuit 26 receives write data through the data terminals DQ (DQ0–7), and outputs the received data to the common data bus CDB.

The arbiter 28 compares the transition edges of the access timing signal ATDPZ (access request) and the refresh timing signal SRTPZ (refresh request) to determine whether a conflict occurs between these requests, and determines which to give precedence to, an access operation or a refresh operation. When an access operation has precedence, the arbiter 28 temporarily holds the refresh timing signal SRTPZ, and outputs a read timing signal RDPZ or a write timing signal WRPZ in response to the read request signal RDZ or the write request signal WRZ. The arbiter 28 then detects the completion of the access operation from the inactivation (a change to high level) of a core cycle state signal ICSX, outputs a refresh start signal REFPZ in accordance with the held refresh timing signal SRTPZ, and outputs a refresh state signal REFZ (refresh control signal). The refresh state signal REFZ is a signal for indicating that a refresh operation is in execution.

When a refresh operation has precedence, the arbiter 28 temporarily holds the access timing signal ATDPZ, and outputs the refresh start signal REFPZ and the refresh state signal REFZ in response to the refresh timing signal SRTPZ. The arbiter 28 then detects the completion of the refresh operation from the inactivation (a change to high level) of the core cycle state signal ICSX, and outputs the read timing signal RDPZ or the write timing signal WRPZ in accordance with the held access timing signal ATDPZ.

The refresh decision circuit (detecting circuit) 30 outputs the skip signal SKIPZ (detection signal) in the test mode (TESTZ=high level) when it receives the next refresh timing signal SRTPZ before receiving the refresh state signal REFZ corresponding to a refresh timing signal SRTPZ. In other words, the skip signal SKIPZ is output when the next refresh request occurs before the refresh operation corresponding to a refresh request (IREFZ or EREFZ) is performed.

The access timing generator 10, the command decoder 12, and the arbiter 28 operate as a command control circuit which outputs an access control signal (the read timing signal RDPZ or the write timing signal WRPZ) for accessing the memory cells MC to be described later in response to an access request signal (read command or write command) supplied through the command terminal CMD.

The row operation control circuit 32 outputs a row control signal RASZ, which is a basic timing signal for operating the memory core 36, when it receives the read timing signal RDPZ, the write timing signal WRPZ, or the refresh timing signal SRTPZ. The row operation control circuit 32 maintains the core cycle state signal ICSX at low level when the memory core 36 is in operation.

The core control circuit 34 has a word line control circuit, a sense amplifier control circuit, and a precharge control circuit which are not shown. The word line control circuit outputs a word line control signal TWZ for selecting word lines WL to be described later, in response to the row control signal RASZ. The sense amplifier control circuit outputs a sense amplifier activating signal LEZ for activating sense amplifiers in a sense amplifier part SA to be described later, in response to the row control signal RASZ. The precharge control circuit outputs a bit line resetting signal BRS when bit lines BL, /BL are not in use.

The row operation control circuit 32 and the core control circuit 34 operate as an operation control circuit which makes the memory core 36 perform an access operation in response to the read timing signal RDPZ (access control signal) or the write timing signal WRPZ (access control signal) and makes the memory core 36 perform first and second refresh operations in response to first and second refresh control signals REFZ.

The memory core 36 has a memory cell array ARY, a word decoder part WDEC, the sense amplifier part SA, a column decoder part CDEC, a sense buffer part SB, and a write amplifier part WA. The memory cell array ARY has a plurality of volatile memory cells MC (dynamic memory cells), along with a plurality of word lines WL and a plurality of bit lines BL, /BL (complementary bit lines) connected to the memory cells MC. The memory cells MC are the same as typical DRAM memory cells, each having a capacitor for retaining data in the form of an electric charge and a transfer transistor for coupling this capacitor and a bit line BL (or /BL). The gate of the transfer transistor is connected to a word line WL. Through the selection of the word lines WL, any one of a read operation, a write operation, and a refresh operation is performed. The memory cell array ARY performs any one of the read operation, write operation, and refresh operation before executing a precharge operation for precharging the bit lines BL, /BL to a predetermined voltage in response to the bit line resetting signal BRS.

The word decoder part WDEC, when receiving the word line control signal TWZ of high level, selects any one of the word lines WL according to the internal row address signal IRAD and changes the selected word line WL to high level. The column decoder part CDEC outputs a column line signal for turning on column switches which connect respective bit lines BL, /BL and a data bus DB, in accordance with the column address signal CAD.

The sense amplifier part SA has a plurality of sense amplifiers. The sense amplifiers operate in response to the sense amplifier activating signal LEZ and amplify data on the respective bit lines BL, /BL in signal quantity. The data amplified by the sense amplifiers is transmitted to the data bus DB through the column switches in read operation. In write operation, the data is written to the memory cells MC through the bit lines.

The sense buffer part SB amplifies the read data on the data bus DB in signal quantity, and outputs the resultant to the common data bus CDB. The write amplifier part WA amplifies the write data on the common data bus CDB in signal quantity, and outputs the resultant to the data bus DB.

Figure 2:
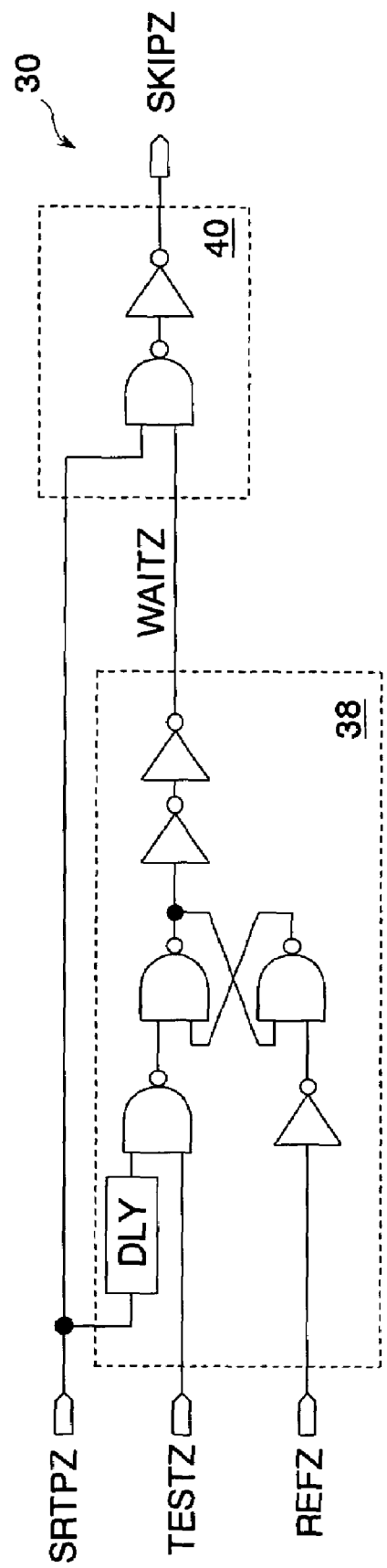
FIG. 2 is a circuit diagram showing the details of the refresh decision circuit shown in FIG. 1.

FIG. 2 shows the details of the refresh decision circuit 30 shown in FIG. 1.

The refresh decision circuit 30 has a refresh latch circuit 38 and a skip detecting circuit 40.

In test mode (TESTZ=high level), the refresh latch circuit 38 changes a wait signal WAITZ to high level in response to the refresh timing signal SRTPZ after the delay time of its delay circuit DLY, and changes the wait signal WAITZ to low level in response to the refresh state signal REFZ. The skip detecting circuit 40 outputs the skip signal SKIPZ when it receives the refresh timing signal SRTPZ while the wait signal WAITZ is at high level. That is, the skip signal SKIPZ changes to high level when a new refresh request occurs before the refresh operation (REFZ) corresponding to the refresh request (SRTPZ) is performed (started).

Figure 3:
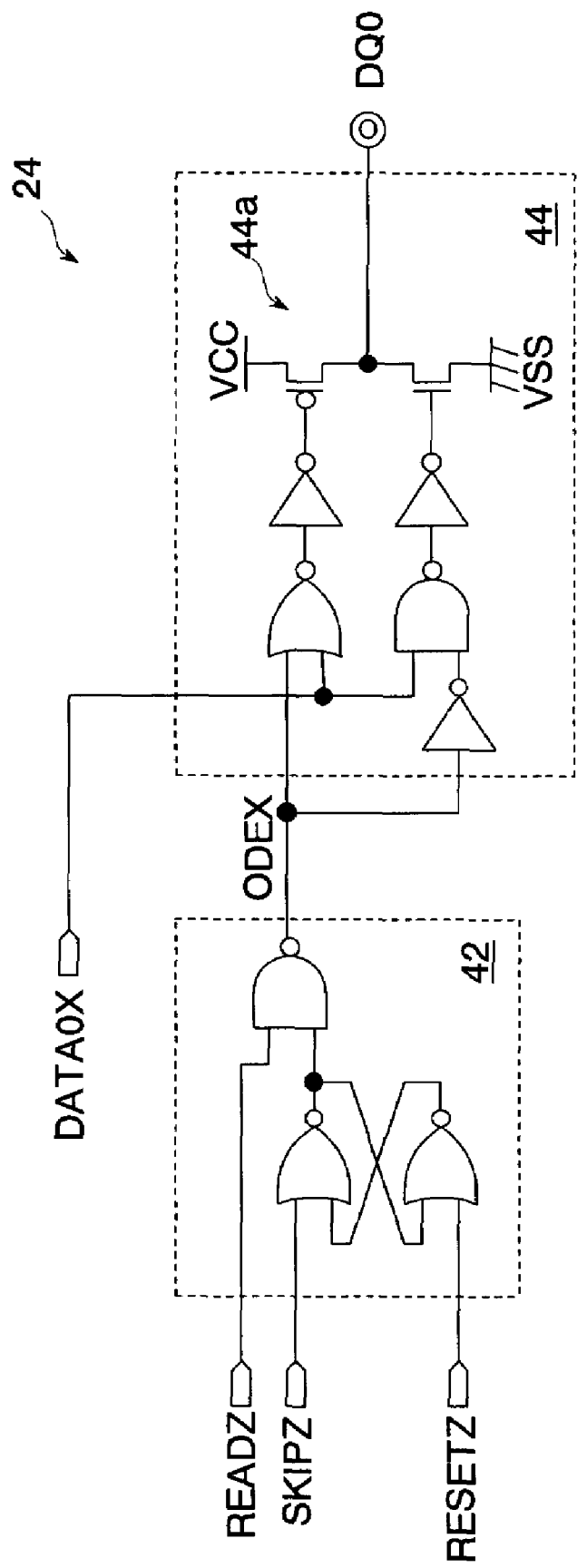
FIG. 3 is a circuit diagram showing the details of the data output circuit shown in FIG. 1.

FIG. 3 shows the details of the data output circuit 24 shown in FIG. 1.

The data output circuit 24 has an output mask circuit 42 and output buffer circuits 44. Note that FIG. 3 shows the output buffer circuit 44 that corresponds to the data terminal DQ0. The output buffer circuits corresponding to the other data terminals DQ1–7 are the same as the output buffer circuit 44. The output mask circuit 42 is common among the output buffer circuits 44 corresponding to the data terminals DQ0–7.

The output mask circuit 42 is reset by a reset signal RESETZ of high level, and inverts and outputs a read timing signal READZ as an output enable signal ODEX. The output mask circuit 42 prohibits the output of the read timing signal READZ when it receives the skip signal SKIPZ of high level. That is, the output enable signal ODEX is kept at high level by the skip signal SKIPZ of high level.

When the output enable signal ODEX is at low level, the output buffer circuit 44 operates its tristate output buffer 44a in accordance with the logic level of read data DATA0X, outputting a high level or low level to the data terminal DQ0. When the output enable signal ODEX is at high level, the output buffer circuit 44 changes the output of the tristate output buffer 44a to a high impedance state. That is, in test mode, the output mask circuit 42 controls the tristate output buffer 44a so as to prohibit the output of the read data DATA0X to the data terminal DQ0 in response to the skip signal SKIPZ and set the data terminal DQ0 to a high impedance state.

Figure 4:
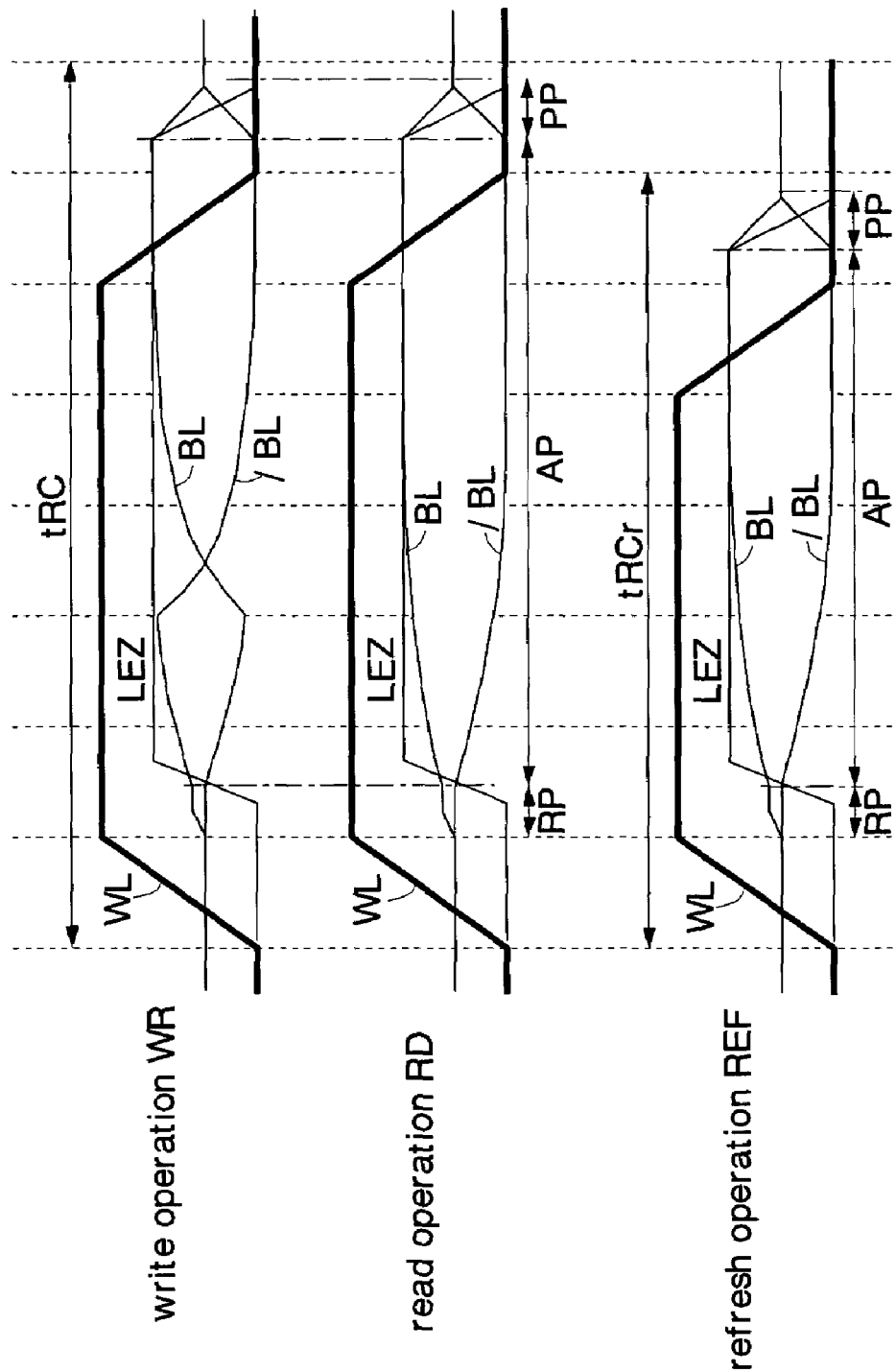
FIG. 4 is a timing chart showing the basic operation of the memory cell array in the first embodiment.

FIG. 4 shows the basic operations of the memory cell array ARY in the first embodiment.

In this embodiment, a write operation WR and a read operation RD are performed in an identical cycle time tRC. A refresh operation REF is performed in a cycle time tRCr which is shorter than the cycle time tRC. The write operation WR, the read operation RD, and the refresh operation REF each consist of a read stage RP, an amplifying stage AP, and a precharging stage PP.

The read stage RP is a period where data is read to the bit lines BL (or /BL) from memory cells MC that are selected in response to the activation (selection) of a word line WL. The amplifying stage AP is a period where, after the read of data to the bit lines BL (or /BL), the sense amplifiers are activated in response to the sense amplifier activating signal LEZ to amplify the voltage differences (data) of the bit lines BL, /BL, and the amplified voltages of the bit lines BL, /BL are rewritten to the data-read memory cells MC. The precharging stage PP is a period where the word line WL is inactivated (deselected) and the bit lines BL, /BL are precharged to a predetermined voltage.

In the write operation WR, data that is read from the memory cells MC and amplified on the bit lines BL, /BL must be inverted by the write data. This makes the cycle time of the write operation WR longer than those of the other operations. The read operation RD can thus be rendered shorter than the write operation WR in cycle time. Nevertheless, in view of user friendliness, the read operation RD and the write operation WR are given the same value of cycle time tRC.

Meanwhile, in the refresh operation REF, the bit lines BL, /BL need not be connected with the data bus DB, nor need the data be inverted on the bit lines BL, /BL. On this account, even when the cycle time tRCr of the refresh operation REF is shorter than the cycle time tRC, the data retained in the memory cells MC can be fully written to the memory cells MC again. The full write gives each memory cell MC a data retention time (pause time) of 300 ms or more.

In the pseudo SRAM, the refresh operation REF is performed without being recognized by the user. This prevents degradation in usability of a user even when the cycle time tRCr of the refresh operation REF differs from the cycle time tRC of the read operation RD and write operation WR. The reduced cycle time tRCr of the refresh operation REF to be performed automatically inside the pseudo SRAM allows a reduction in access time.

Figure 5:
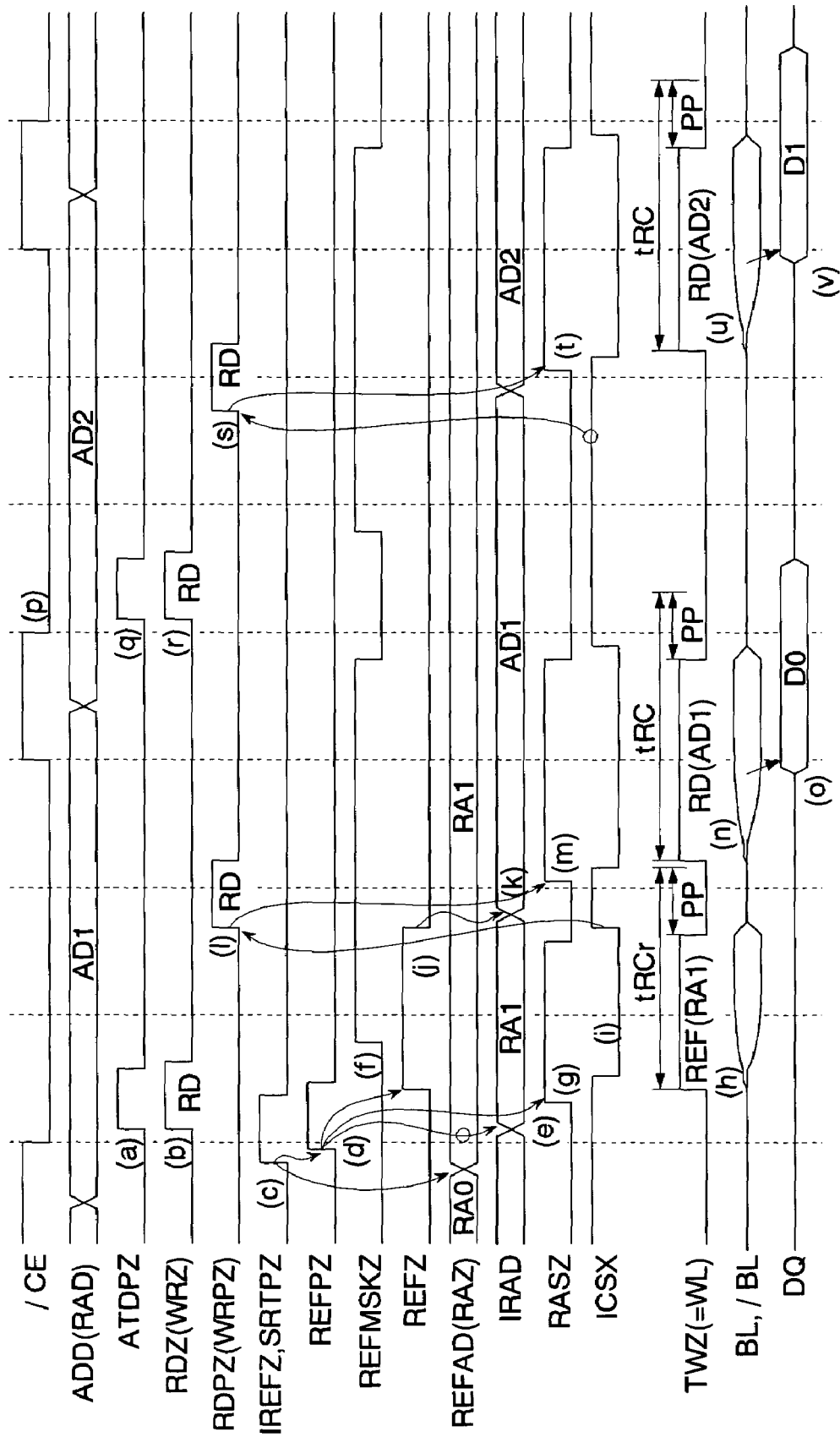
FIG. 5 is a timing chart showing an example of operation of the first embodiment in normal operation mode.

FIG. 5 shows an example of operation of the first embodiment in normal operation mode.

In this example, two read operations RD are performed in succession, and the first read command RD and the internal refresh request signal IREFZ occur almost at the same time.

Initially, the access timing generator 10 shown in FIG. 1 receives the chip enable signal /CE of low level and the output enable signal /OE of low level which is not shown, and outputs the access timing signal ATDPZ (FIG. 5(a)). The command decoder 12 receives the chip enable signal /CE of low level, and the output enable signal /OE of low level and the write enable signal /WE of high level which are not shown. The command decoder 12 detects that a read command RD (read access request) is supplied, and outputs the read request signal RDZ (FIG. 5(b)).

The refresh timer 16 shown in FIG. 2 outputs the internal refresh request signal IREFZ almost at the same time as the supply of the read command RD. The refresh selecting circuit 14 outputs the refresh timing signal SRTPZ in response to the internal refresh request signal IREFZ (FIG. 5(c)).

The arbiter 28 decides to perform the refresh operation in preference to the read operation, and outputs the refresh start signal REFPZ and the refresh state signal REFZ (first refresh control signal) sequentially (FIG. 5(d)). The switching circuit 22 outputs the refresh address signal REFAD (RA1) as the row address signal IRAD (FIG. 5(e)) in order to perform short refresh.

Here, depending on the result of arbitration between the refresh request and the read request, the arbiter 28 outputs a refresh mask signal REFMSKZ (FIG. 5(f)). The refresh mask signal REFMSKZ is a control signal to be used inside the arbiter 28. The period where the refresh mask signal REFMSKZ is at high level represents one in which no refresh operation can be performed due to the execution of a read operation or a write operation. While the refresh mask signal REFMSKZ is at high level, the arbiter 28 prohibits the start of output of the refresh state signal REFZ so that the execution of the refresh operation is masked.

The row operation control circuit 32 outputs the row control signal RASZ in synchronization with the refresh start signal REFPZ (FIG. 5(g)). The core control circuit 34 outputs the word line control signal TWZ and others in response to the row control signal RASZ. Then, the refresh operation REF shown in FIG. 4 is performed before the read operation RD (FIG. 5(h)). The row operation control circuit 32 changes the core cycle state signal ICSX to low level while the refresh operation REF is in execution (FIG. 5(i)).

The arbiter 28 changes the refresh state signal REFZ to low level after the execution of the refresh operation REF (FIG. 5(j)). The switching circuit 22 outputs the address signal ADD (AD1) as the row address signal IRAD (FIG. 5(k)) in order to perform a read operation.

The arbiter 28 outputs the read timing signal RDPZ in response to the rising edge of the core cycle state signal ICSX (FIG. 5(l)). The row operation control circuit 32 outputs the row control signal RASZ in synchronization with the read timing signal RDPZ (FIG. 5(m)). The core control circuit 34 outputs the word line control signal TWZ and others in response to the row control signal RASZ. Then, the read operation RD shown in FIG. 4 is performed (FIG. 5(n)). The read data D0 amplified on the bit lines BL, /BL by the read operation RD is output to the data terminals DQ through the common data bus CDB (FIG. 5(o)).

As shown in FIG. 4, the refresh operation REF is completed in a shorter time than the read operation RD and the write operation WR are. Thus, even when a conflict occurs between a refresh request and an access request and the refresh request has precedence, the access operation corresponding to the access request can be started earlier. That is, it is possible to reduce the chip enable access time that elapses from the falling edge of the chip enable signal /CE to the output of data to the data terminals DQ.

Next, the pseudo SRAM receives a read command (the chip enable signal /CE of low level, and the output enable signal /OE of low level and the write enable signal /WE of high level which are not shown) (FIG. 5(p)). The access timing generator 10 outputs the access timing signal ATDPZ in response to the read command (FIG. 5(q)). The command decoder 12 receives the chip enable signal /CE of low level, and the output enable signal /OE of low level and the write enable signal /WE of high level which are not shown. The command decoder 12 detects that a read command RD (read access request) is supplied, and outputs the read request signal RDZ (FIG. 5(r)).

The arbiter 28 outputs the read timing signal RDPZ after a predetermined time in response to the high level of the core cycle state signal ICSX (FIG. 5(s)). The row operation control circuit 32 outputs the row control signal RASZ in synchronization with the read timing signal RDPZ (FIG. 5(t)). The core control circuit 34 outputs the word line control signal TWZ and others in response to the row control signal RASZ. Then, the read operation RD corresponding to the address signal AD2 is performed (FIG. 5(u)). The read data D1 amplified on the bit lines BL, /BL by the read operation RD is output to the data terminals DQ through the common data bus CDB (FIG. 5(v)).

Note that this pseudo SRAM is designed so that the sum of the execution time of the refresh operation REF and the execution time of a single access operation (read operation RD or write operation WR) is smaller than a single unit of external access cycle time, or the minimum interval of supplying access requests. It is therefore possible to perform both the refresh operation REF and a single read operation RD (or write operation WR) in a single unit of external access cycle time. That is, the pseudo SRAM can perform refresh operations without being recognized from the exterior.

Figure 6:
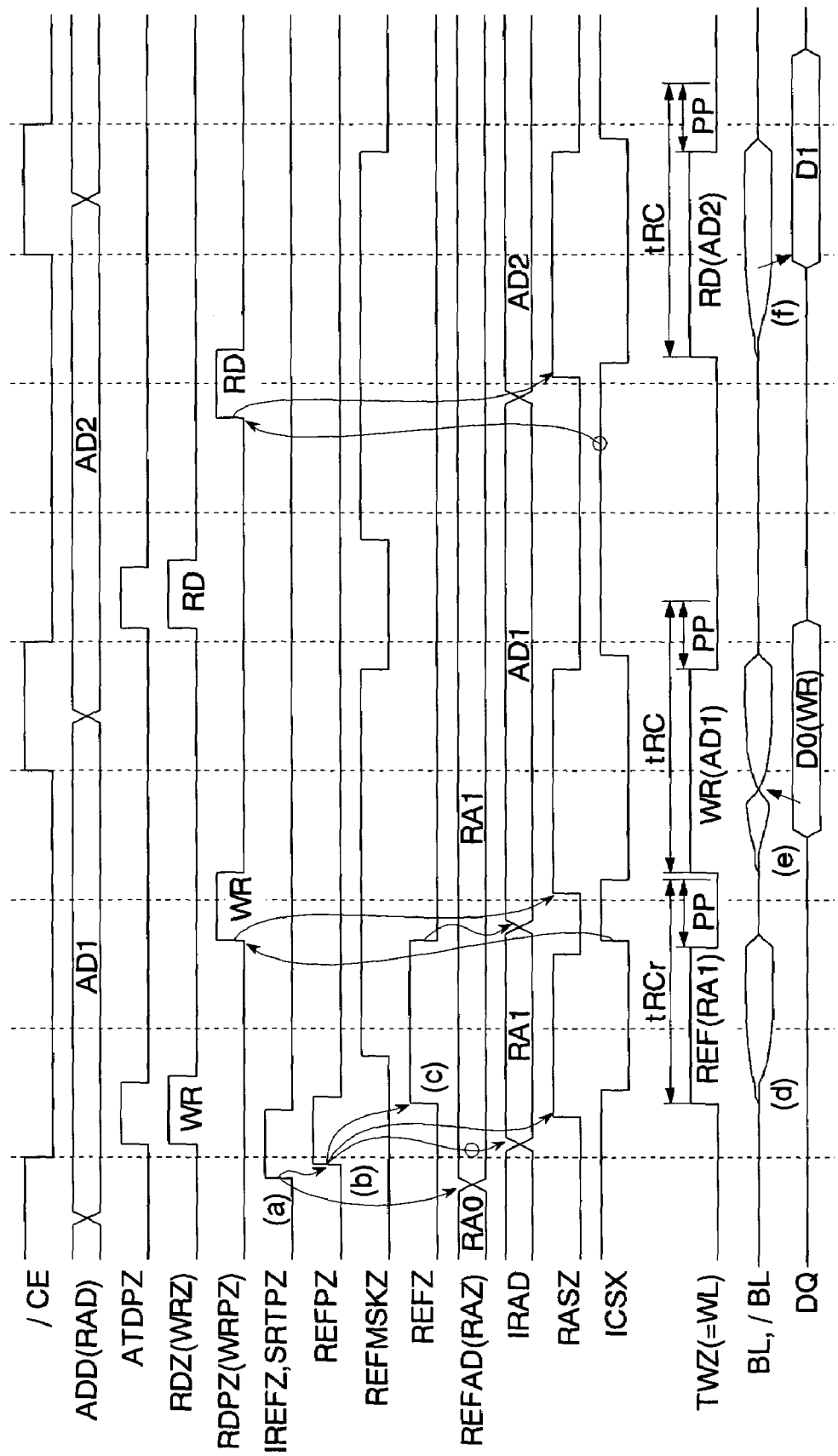
FIG. 6 is a timing chart showing another example of the operation of the first embodiment in normal operation mode.

FIG. 6 shows another example of the operation of the first embodiment in normal operation mode. Detailed description will be omitted of the same operations as in FIG. 5.

In this example, a write operation WR and a read operation RD are performed in succession, and the write command and the internal refresh request signal IREFZ occur almost at the same time.

The refresh timer 16 outputs the internal refresh request signal IREFZ almost at the same time as the supply of the write command WR (FIG. 6(a)). The arbiter 28 decides to perform the refresh operation in preference to the write operation, and outputs the refresh start signal REFPZ and the refresh state signal REFZ sequentially (FIG. 6(b), (c)).

Then, as in FIG. 5, the refresh operation REF, the write operation WR (access operation), and the read operation RD (access operation) are performed sequentially (FIGS. 6(d), (e), (f)).

Figure 7:
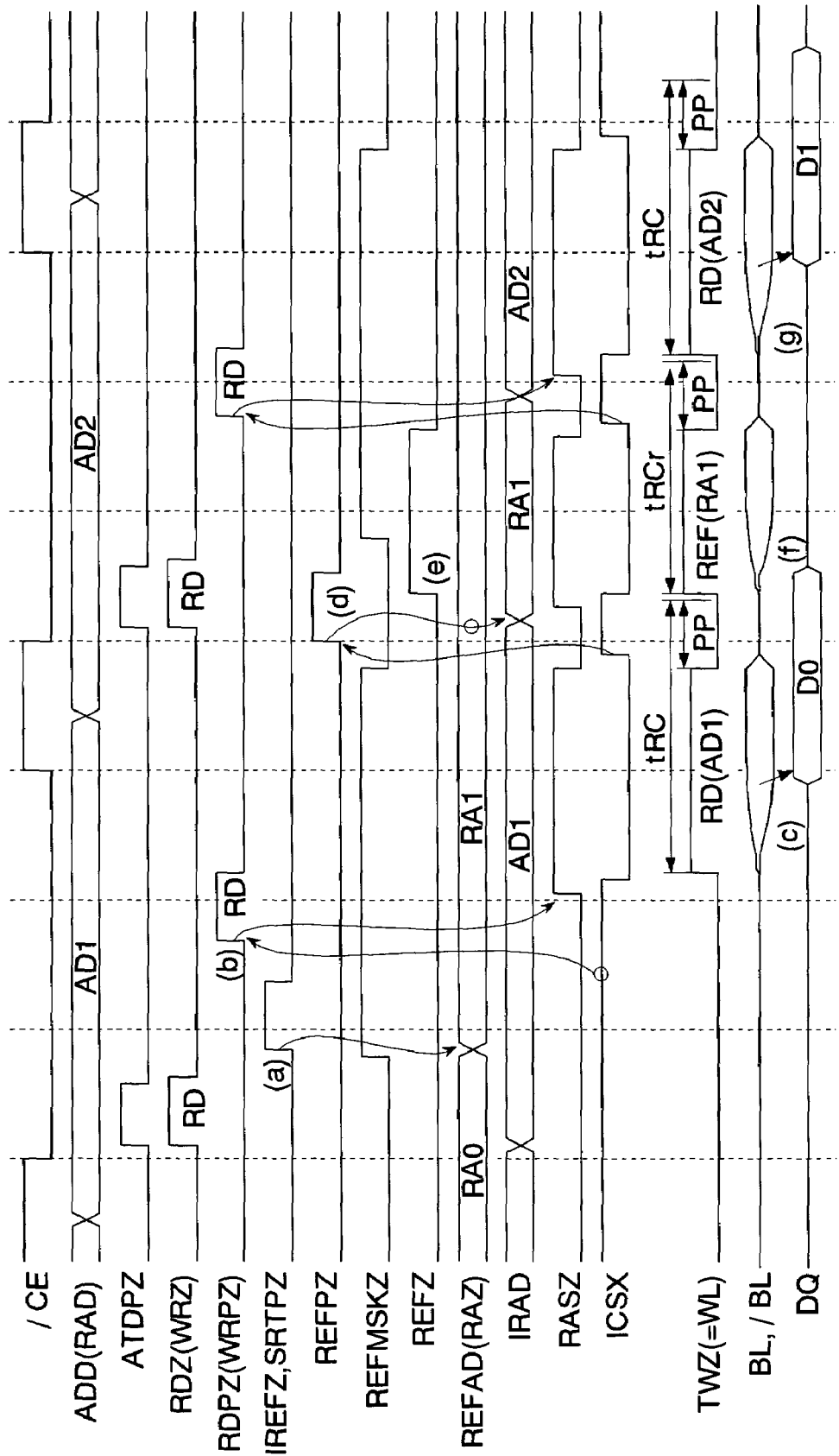
FIG. 7 is a timing chart showing another example of the operation of the first embodiment in normal operation mode.

FIG. 7 shows another example of the operation of the first embodiment in normal operation mode. Detailed description will be omitted of the same operations as in FIG. 5.

In this example, two read operations RD are performed in succession, and the internal refresh request signal IREFZ occurs after the supply of the first read command RD (FIG. 7(a)).

The arbiter 28 receives the access timing signal ATDPZ before the refresh timing signal SRTPZ. The arbiter 28 thus decides to perform the read operation in preference to the refresh operation (REFMSKZ signal=high level). Then, the arbiter 28 outputs the read timing signal RDPZ without outputting the refresh start signal REFPZ or the refresh state signal REFZ (FIG. 7(b)). The read operation RD corresponding to the address AD1 is performed in preference to the refresh operation (FIG. 7(c)).

The arbiter 28 outputs the refresh start signal REFPZ in synchronization with the rising edge of the core cycle state signal ICSX that is associated with the completion of the read operation RD (FIG. 7(d)). Since the refresh mask signal REFMSKZ is at low level, the arbiter 28 outputs the refresh state signal REFZ (FIG. 7(e)). Then, as in FIG. 5, the refresh operation REF and the read operation RD corresponding to the address AD2 are performed sequentially (FIG. 7(f), (g)). As above, when the read command RD (access request) has precedence over the internal refresh request signal IREFZ, the arbiter 28 outputs the read timing signal RDPZ before outputting the refresh state signal REFZ (second refresh control signal).

Figure 8:
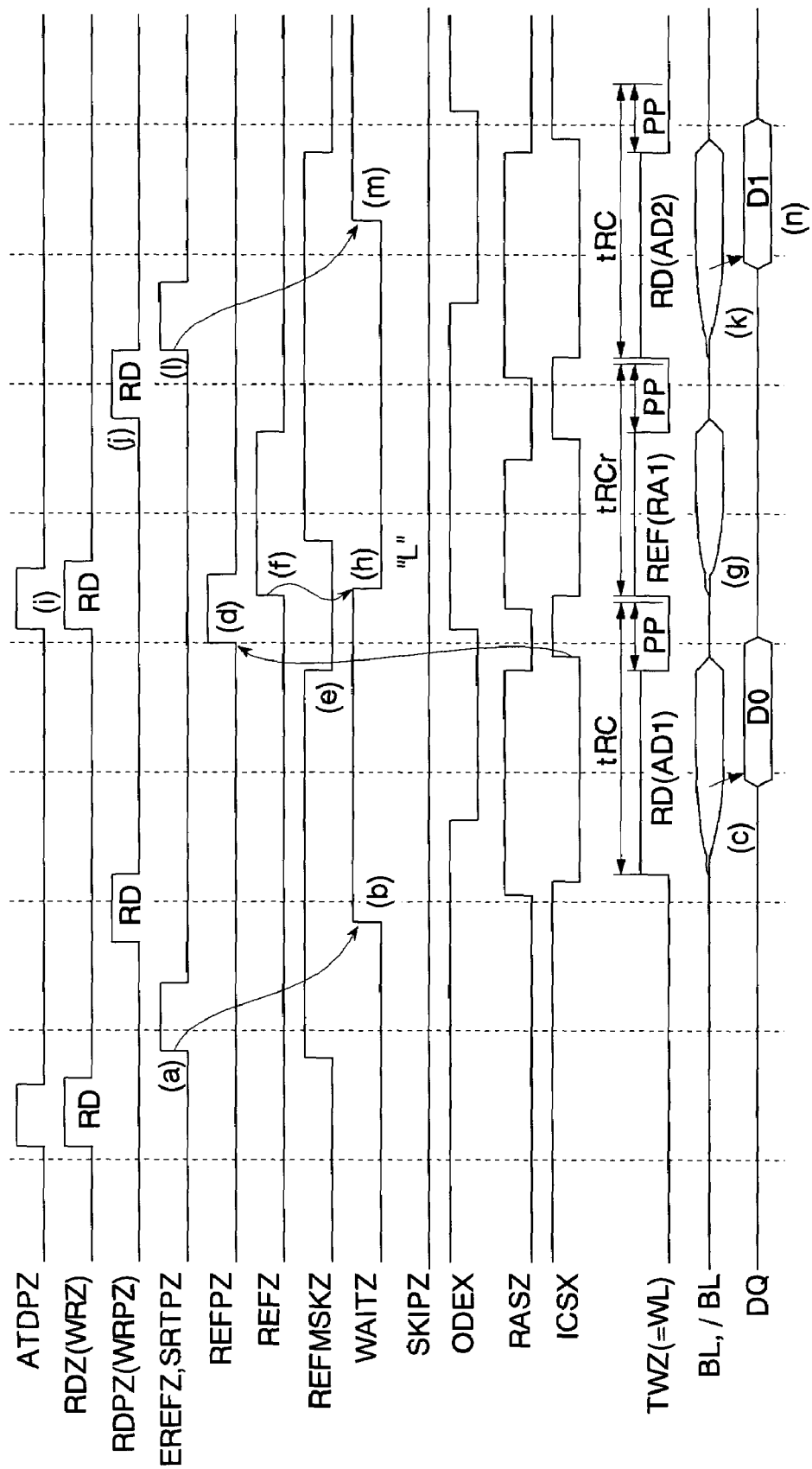
FIG. 8 is a timing chart showing an example of the operation of the first embodiment in test mode.

FIG. 8 shows an example of the operation of the first embodiment in test mode. Detailed description will be omitted of the same operations as in FIGS. 5 and 7. In this example, the pseudo SRAM has already shifted from normal operation mode to test mode. The test mode is used, for example, in characteristic evaluations of the pseudo SRAM under development. The characteristic evaluations are effected by connecting the pseudo SRAM in a wafer state with probers and inputting test patterns to the pseudo SRAM from the LSI tester.

In test mode, access requests are supplied in succession to determine the minimum interval of supplying access requests at which the access operations are performed with refresh operations inserted between the access operations. The basic timing of FIG. 8 is the same as in FIG. 7 seen above. That is, in this example, the refresh operation can be inserted between the access operations.

In test mode, the refresh selecting circuit 14 shown in FIG. 1 masks the internal refresh request signal IREFZ output from the refresh timer 16, receives the test refresh request signal EREFZ supplied from the LSI tester through the test terminal SRC instead of the internal refresh request signal IREFZ, and outputs it as the refresh timing signal SRTPZ (FIG. 8(a)). The test refresh request signal EREFZ is supplied after the supply of the read command RD.

The refresh latch circuit 38 of the refresh decision circuit 30 shown in FIG. 2 changes the wait signal WAITZ to high level after the delay time of the delay circuit DLY in response to the refresh timing signal SRTPZ and the test signal TESTZ of high level (FIG. 8(b)).

Since the test refresh request signal EREFZ is supplied after the supply of the read command RD, the read operation is performed before the refresh operation REF (FIG. 8(c)). The arbiter 28 outputs the refresh start signal REFPZ in synchronization with the rising edge of the core cycle state signal ICSX that is associated with the completion of the read operation RD (FIG. 8(d)). The arbiter 28 changes the refresh mask signal REFMSKZ to low level in response to the completion of the read operation RD (FIG. 8(e)). Due to the low level of the refresh mask signal REFMSKZ, the refresh state signal REFZ is output (FIG. 8(f)). Then, the refresh operation REF is performed as in FIG. 5 (FIG. 8(g)). The refresh latch circuit 38 changes the wait signal WAITZ to low level in response to the refresh state signal REFZ (FIG. 8(h)).

Next, the pseudo SRAM receives a read command. The access timing generator 10 and the command decoder 12 output the access timing signal ATDPZ and the read request signal RDZ in response to the read command (FIG. 8(i)). The decision circuit 30 outputs the read timing signal RDPZ in synchronization with the completion of the refresh operation (FIG. 8(j)). Then, the read operation is started (FIG. 8(k)).

The pseudo SRAM receives the test refresh request signal EREFZ from the LSI tester immediately after the generation of the read timing signal RDPZ. The refresh timing signal SRTPZ is output in synchronization with the test refresh request signal EREFZ (FIG. 8(l)). In test mode, refresh requests (test refresh request signals EREFZ) of desired timing can be supplied from the exterior of the pseudo SRAM. As a result, signals of timing impossible in the normal operation of the pseudo SRAM can be generated for detailed, efficient tests.

The refresh latch circuit 38 changes the wait signal WAITZ to high level after the delay time of the delay circuit DLY in response to the refresh timing signal SRTPZ and the test signal TESTZ of high level (FIG. 8(m)). Since the wait signal WAITZ is at low level at the time of output of the refresh timing signal SRTPZ, the skip detecting circuit 40 of the refresh decision circuit 30 shown in FIG. 2 will not output the skip signal SKIPZ.

Thus, in the read operation, the data D1 read from the memory cells MC is output to the data terminals DQ (FIG. 8(n)). The LSI tester receives the normal read data D1 from the pseudo SRAM, and recognizes that the refresh operation REF is inserted between the read operations RD.

Figure 9:
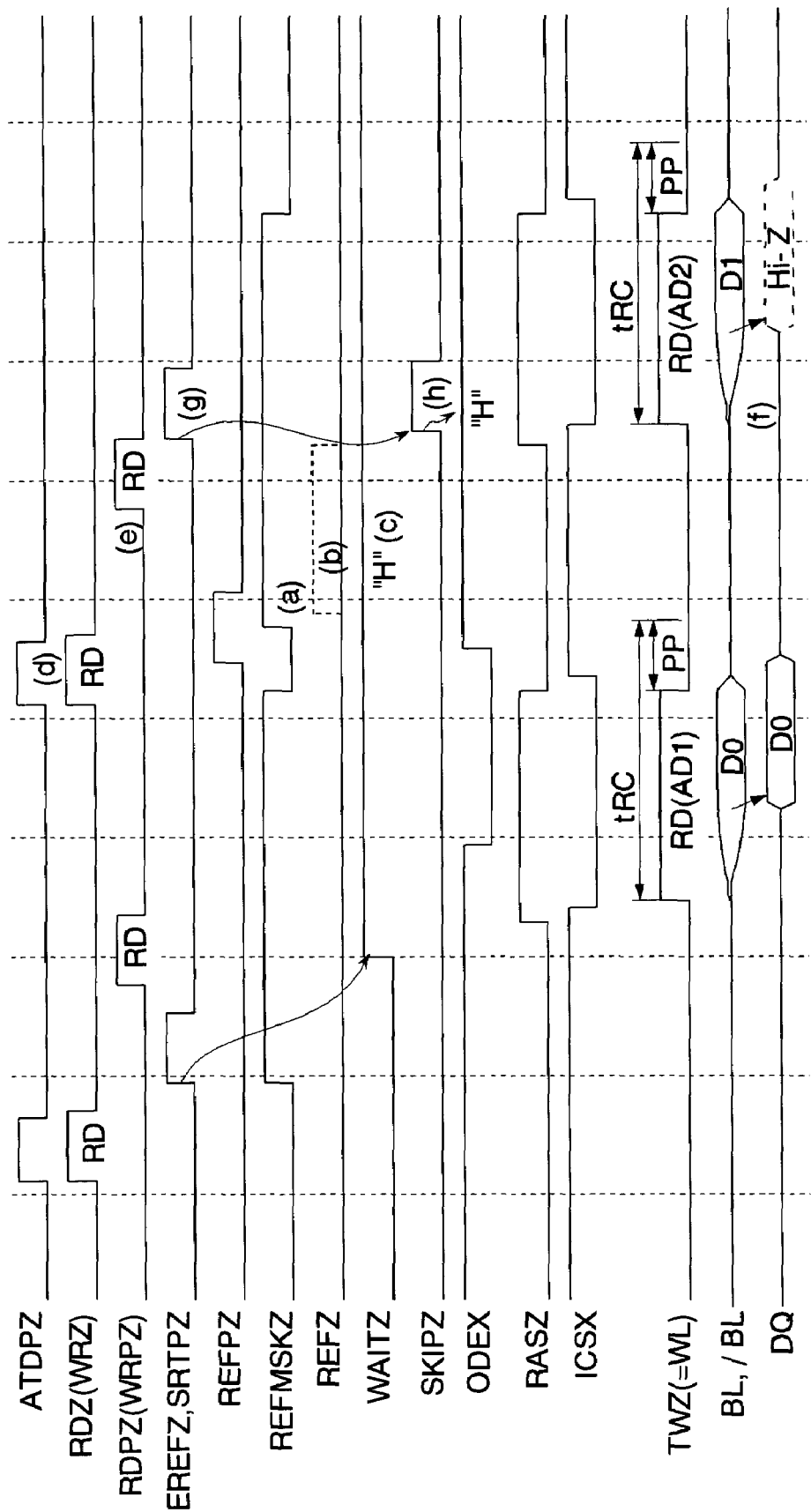
FIG. 9 is a timing chart showing another example of the operation of the first embodiment in test mode.

FIG. 9 shows another example of the operation of the first embodiment in test mode. Detailed description will be omitted of the same operations as in FIGS. 5, 7, and 8. In this example, read commands RD are supplied at an interval shorter than in FIG. 8, so that the refresh operation cannot be inserted between the access operations.

Due to the shorter interval of supply of the read commands RD, the arbiter 28 changes the refresh mask signal REFMSKZ to high level immediately after the reception of the core cycle state signal ICSX that is associated with the first read operation RD (FIG. 9(a)). This masks the output of the refresh state signal REFZ (FIG. 9(b)). In the absence of supply of the refresh state signal REFZ, the row operation control circuit 32 cancels reception of the refresh start signal REFPZ, not outputting the row control signal RASZ. Consequently, the refresh operation REF will not be performed. Not receiving the refresh state signal REFZ, the refresh latch circuit 38 holds the high level "H" of the wait signal WAITZ (FIG. 9(c)).

The pseudo SRAM receives a read command. The access timing generator 10 and the command decoder 12 output the access timing signal ATDPZ and the read request signal RDZ in response to the read command (FIG. 9(d)). Since the core cycle state signal ICSX is at high level, the decision circuit 30 outputs the read timing signal RDPZ after a predetermined time since the reception of the access timing signal ATDPZ (FIG. 9(e)). Then, the read operation is started (FIG. 9(f)).

The pseudo SRAM receives the test refresh request signal EREFZ from the LSI tester immediately after the generation of the read timing signal RDPZ. The refresh timing signal SRTPZ is output in synchronization with the test refresh request signal EREFZ (FIG. 9(g)). The wait signal WAITZ is kept at high level when the refresh timing signal SRTPZ is output. The skip detecting circuit 40 thus outputs the skip signal SKIPZ in synchronization with the refresh timing signal SRTPZ (FIG. 9(h)).

In response to the skip signal SKIPZ, the output mask circuit 42 of the data output circuit 24 shown in FIG. 3 masks the read timing signal READZ to fix the output enable signal ODEX to high level. This inactivates the output buffer circuits 44 of the data output circuit 24 shown in FIG. 3, so that the tristate output buffers 44a prohibit the read data D1 associated with the read operation RD from being output to the data terminals DQ and set the data terminals DQ to a high impedance state Hi-Z (FIG. 9(i)).

That is, in test mode, the data terminals DQ enter the high impedance state Hi-Z when the next refresh request occurs before the refresh operation REF is performed. Here, refresh requests can be generated at desired timing independent of the refresh timer 16, so that the test can be conducted in a short time. Since no dedicated test terminal is required in effecting the test, the pseudo SRAM can be prevented from an increase in chip size.

In actual evaluations, an evaluation board having its data terminals DQ pulled up (logic "1") or a probe card is loaded into the LSI tester so that logic "0" is written to the memory cells MC in advance. Then, in the test described above, when the logic "0" cannot be read and an error occurs, it is determined that the next refresh request has occurred before the refresh operation REF is performed.

In FIGS. 8 and 9, the access command to be supplied first may be a write command WR, not the read command RD. The access command to be supplied second must be a read command RD for the sake of a pass/fail evaluation by the LSI tester.

Incidentally, whether or not refresh operations are performed normally in a pseudo SRAM having a short refresh function can be evaluated by checking if the data written in the memory cells MC disappears actually. To be more specific, tests for evaluating the memory cells for data retention characteristics (commonly referred to as pause tests) should be conducted with gradual decreases in the interval of supply of access commands. The data written in DRAM memory cells MC is, however, retained for several hundreds of milliseconds to several seconds. Then, checking the proper execution of refresh operations through pause tests can require enormous amounts of test time.

As above, in the first embodiment, the data terminals DQ are set at the high impedance state Hi-Z in test mode, when the next refresh request occurs before the refresh operation REF is performed. Thus, the evaluation system for evaluating the pseudo SRAM, such as an LSI tester, can easily and precisely evaluate the access command interval below which the refresh operation REF is no longer insertable. That is, the minimum interval of access commands can be evaluated easily. As a result, the development period of the pseudo SRAM can be reduced with a reduction in development cost. In mass production of the pseudo SRAM, defects which have occurred due to variations of manufacturing conditions and the like can be analyzed promptly, allowing the minimization of the low yield period.

The data terminals DQ in connection with the tristate output buffers 44a are used as external test terminals in test mode. This eliminates the need for forming new terminals for evaluation, and can thus prevent an increase in the chip size of the pseudo SRAM.

Figure 10:
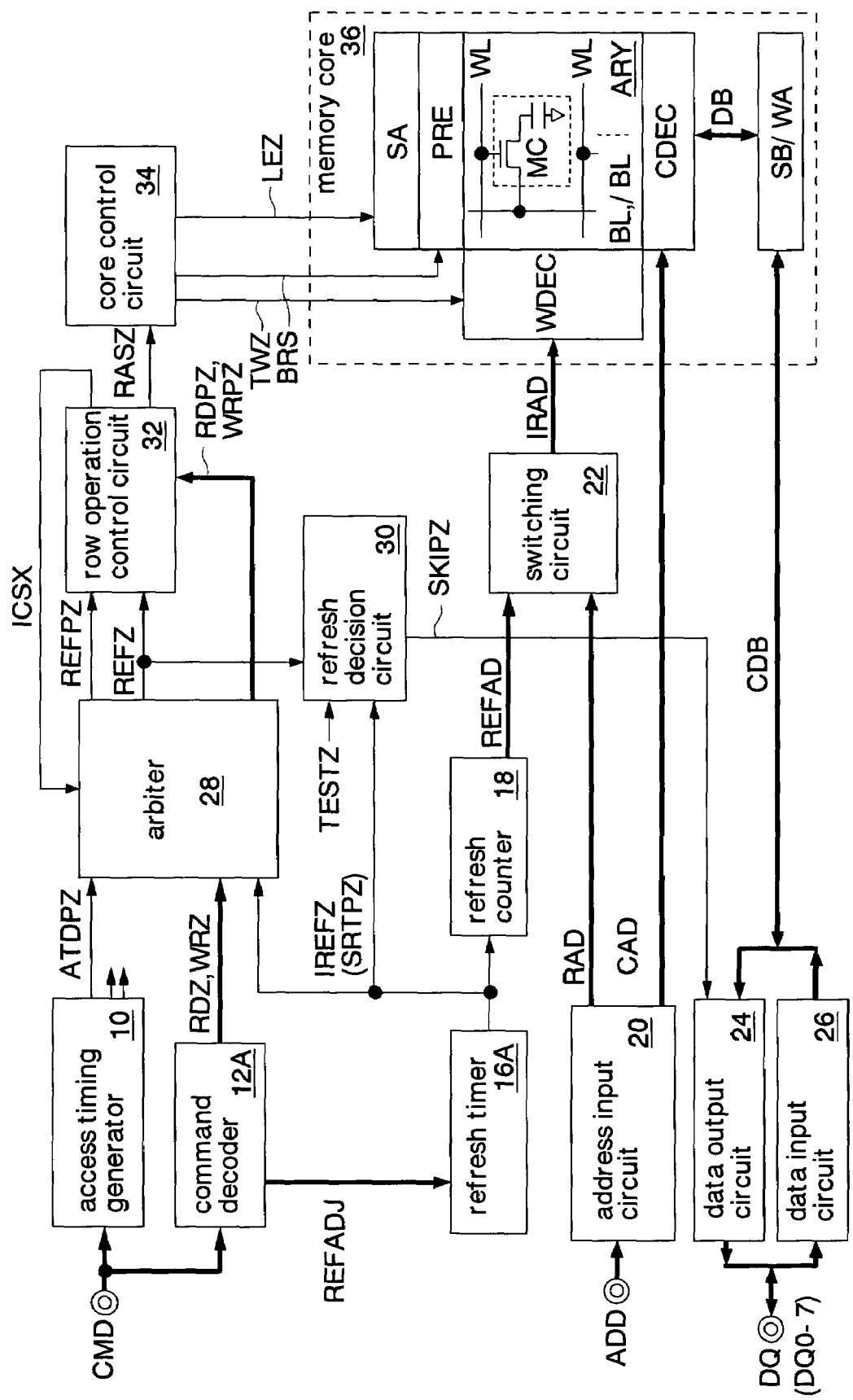
FIG. 10 is a block diagram showing a second embodiment of the semiconductor memory of the present invention.

FIG. 10 shows a second embodiment of the semiconductor memory of the present invention. The same elements as those described in the first embodiment will be designated by identical reference numbers or symbols. Detailed description thereof will be omitted here.

In this embodiment, a command decoder 12A and a refresh timer 16A are formed instead of the command decoder 12 and the refresh timer 16 of the first embodiment. Moreover, this embodiment has neither the refresh selecting circuit 14 nor the external test terminal SRC. The rest of the configuration is almost the same as in the first embodiment.

The command decoder 12A decodes the command signals CMD, and outputs a read request signal RDZ for performing a read operation or a write request signal WRZ for performing a write operation. In test mode, the command decoder 12A outputs a refresh adjustment signal REFADJ for changing the cycle of the refresh timer 16A in accordance with the command signals CMD (test command) supplied to the command terminal CMD.

The refresh timer 16A outputs the internal refresh request signal IREFZ at redetermined cycles. In normal operation mode, the internal refresh request signal IREFZ is generated in cycles by which the memory cells MC can be refreshed sequentially without losing the data retained in the memory cells MC. In test mode, the internal refresh request signal IREFZ is generated in cycles corresponding to the logic value of the refresh adjustment signal REFADJ.

In this embodiment, the cycle of the refresh timer 16A is changed by the test command supplied through the command terminal CMD while evaluations are performed as in the first embodiment.

As above, the second embodiment can provide the same effects as those of the first embodiment described above. Moreover, in this embodiment, the refresh timer 16A receives the refresh adjustment signal REFADJ for changing the cycle of generation of refresh requests in test mode. It is therefore possible to generate refresh requests of desired timing inside the pseudo SRAM by using circuits that operate in normal operation. The refresh characteristics can thus be evaluated under the same conditions as those in the actual circuit operations of the pseudo SRAM.

Figure 11:
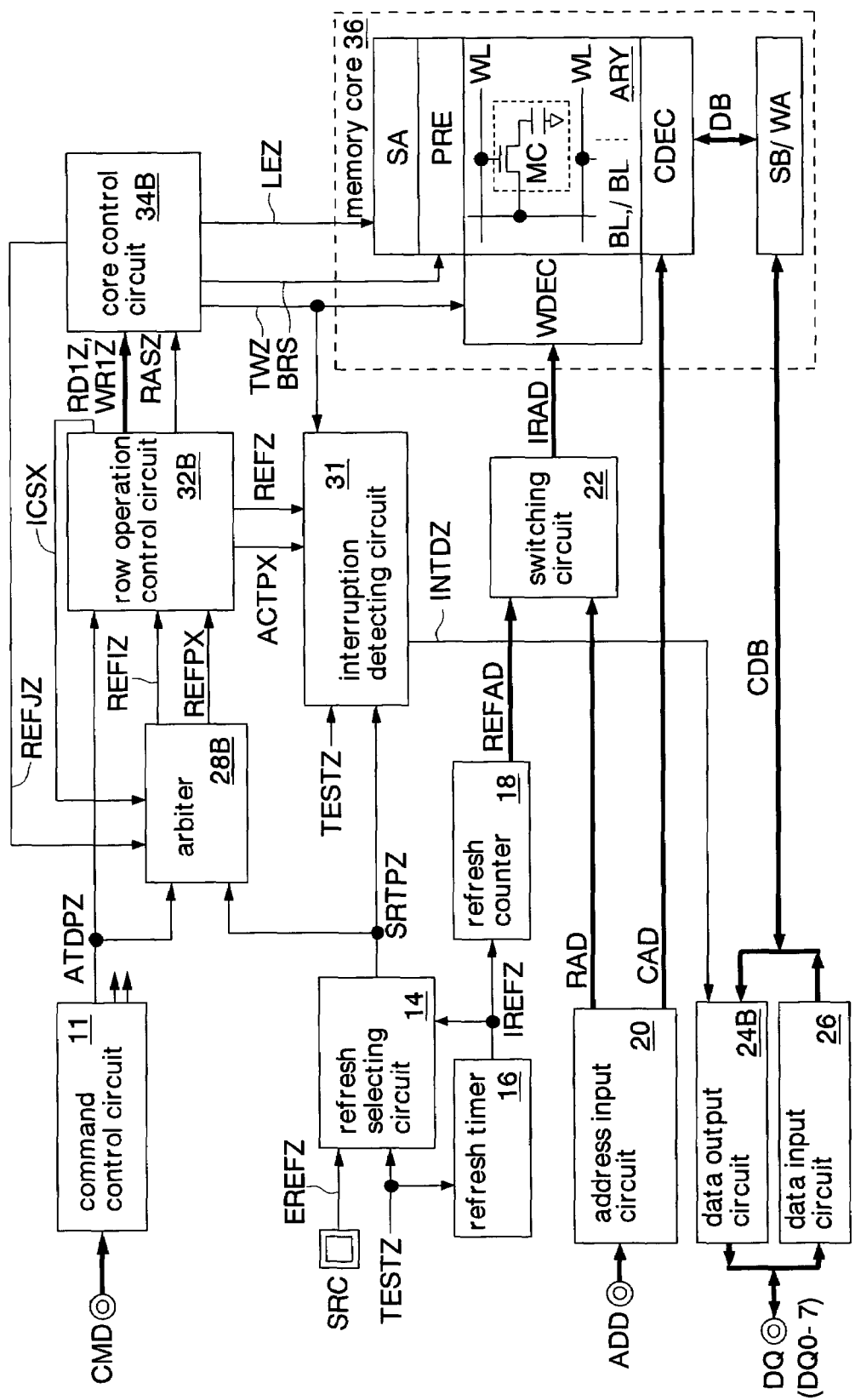
FIG. 11 is a block diagram showing a third embodiment of the semiconductor memory of the present invention.

FIG. 11 shows a third embodiment of the semiconductor memory of the present invention. The same elements as those described in the first embodiment will be designated by identical reference numbers or symbols. Detailed description thereof will be omitted here.

In this embodiment, the access timing generator 10 and the command decoder 12 of the first embodiment are formed as a command control circuit 11. Besides, a data output circuit 24B, an arbiter 28B, an interruption detecting circuit 31, a row operation control circuit 32B, and a core control circuit 34B are formed instead of the data output circuit 24, the arbiter 28, the refresh decision circuit 30, the row operation control circuit 32, and the core control circuit 34 of the first embodiment. The rest of the configuration is almost the same as in the first embodiment. That is, the semiconductor memory is formed as a pseudo SRAM that has DRAM memory cells (dynamic memory cells) and an SRAM interface. This pseudo SRAM is used as a work memory to be mounted on a cellular phone, for example.

The command control circuit 11 decodes command signals CMD (including a chip enable signal /CE, an output enable signal /OE, and a write enable signal /WE) supplied through the command terminal CMD, and outputs an access timing signal ATDPZ (access request signal) for performing a read operation or a write operation when it recognizes that the command signals CMD represent an access request. The command control circuit 11 also outputs a read command signal for performing a read operation, a write command signal for performing a write operation, and so on.

The data output circuit 24B receives read data from the memory cells MC through a common data bus CDB, and outputs the received data to data terminals DQ (DQ0–7). In test mode, the data output circuit 24B sets the data terminals DQ0–7 to a high impedance state when it receives an interruption detecting signal INTDZ of high level from the interruption detecting circuit 31. The data output circuit 24B will be detailed in conjunction with FIG. 13.

The arbiter 28B compares the transition edges of the access timing signal ATDPZ (access request) and the refresh timing signal SRTPZ (refresh request) to determine if these requests conflict with each other, and decides which to give precedence to, an access operation or a refresh operation. When the arbiter 28B receives the access timing signal ATDPZ earlier than the refresh timing signal SRTPZ, it temporarily holds the refresh timing signal SRTPZ and maintains a refresh start signal REFPX (refresh control signal) to high level in order to give precedence to the access operation. The arbiter 28B then detects the completion of the access operation from the inactivation (a change to high level) of a core cycle state signal ICSX, and changes the refresh start signal REFPX to low level for a predetermined period so that the refresh operation is performed in accordance with the held refresh timing signal SRTPZ.

When the arbiter 28B receives the refresh timing signal SRTPZ earlier than the access timing signal ATDPZ, it changes the refresh start signal REFPX to low level in response to the refresh timing signal SRTPZ for a predetermined period in order to give precedence to the refresh operation.

Furthermore, when the arbiter 28B receives the access timing signal ATDPZ corresponding to a next access command while a refresh-interruption judging signal REFJZ is at high level, it outputs a refresh interrupting signal REFIZ. The refresh-interruption judging signal REFJZ maintains its high level since the completion of a read operation or a write operation that is performed with precedence over a refresh operation until immediately before a word line WL is activated for the refresh operation. Before the activation of the word line WL, the refresh operation can be interrupted without a crash of the data in the memory cells MC even after the row operation control circuit 32B has started the refresh operation. Consequently, the arbiter 28B also operates as an interruption circuit which outputs the refresh interrupting signal REFIZ for interrupting a refresh operation upon receiving the next access request within a predetermined period since the completion of an access operation. Incidentally, the arbiter 28B keeps holding the refresh request when it outputs the refresh interrupting signal REFIZ.

The interruption detecting circuit 31 operates in test mode (TESTZ=high level), and receives an active signal ACTPX, a refresh state signal REFZ, a word line control signal TWZ, and the refresh timing signal SRTPZ and outputs the interruption detecting signal INTDZ when it detects the interruption of a refresh operation in response to the refresh-interruption judging signal REFJZ. The active signal ACTPX is a signal for indicating the start of a read operation or a write operation. The refresh state signal REFZ is a signal for indicating that a refresh operation is in execution. The interruption detecting circuit 31 will be detailed in conjunction with FIG. 12.

The row operation control circuit 32B outputs the row control signal RASZ, the active signal ACTPX, and a read control signal RD1Z or write control signal WR1Z when it receives the access timing signal ATDPZ without receiving the refresh start signal REFPX. When the row operation control circuit 32B receives the refresh start signal REFPX, it outputs the row control signal RASZ and the refresh state signal REFZ irrespective of the access timing signal ATDPZ. The row operation control circuit 32B also maintains the core cycle state signal ICSX at low level while the memory core 36 is in operation. The row control signal RASZ is a basic timing signal for operating the memory core 36. The read control signal RD1Z and the write control signal WR1Z are signals for performing a read operation and a write operation, respectively.

The core control circuit 34B has a word line control circuit, a sense amplifier control circuit, and a precharge control circuit which are not shown. The word line control circuit outputs a word line control signal TWZ for selecting word lines WL, in response to the row control signal RASZ. The sense amplifier control circuit outputs a sense amplifier activating signal LEZ for activating the sense amplifiers of the sense amplifier part SA, in response to the row control signal RASZ. The precharge control circuit outputs a bit line resetting signal BRS when the bit lines BL, /BL are not in use.

Moreover, as mentioned above, the core control circuit 34B changes the refresh-interruption judging signal REFJZ from low level to high level for a predetermined period since the completion of a read operation or a write operation that is performed with precedence over a refresh operation.

The row operation control circuit 32B and the core control circuit 34B operate as an operation control circuit for making the memory core 36 perform a refresh operation in response to the refresh start signal REFPX, interrupting the refresh operation in execution upon receiving the refresh interrupting signal REFIZ, and making the memory core 36 perform an access operation in response to the access timing signal ATDPZ when the refresh start signal REFPX is not output.

Figure 12:
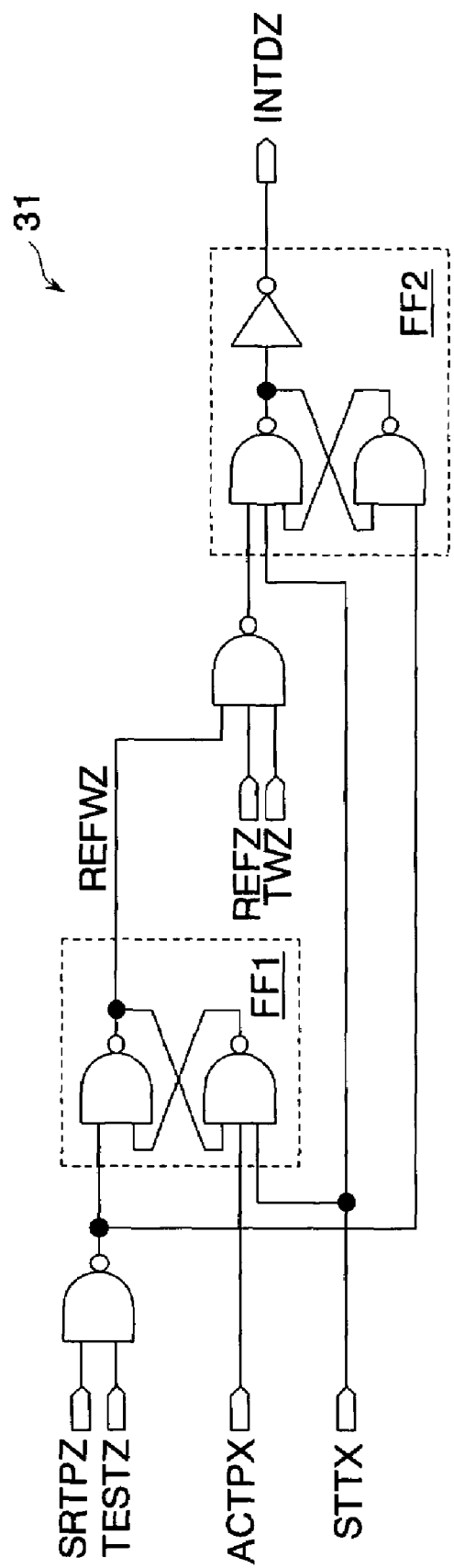
FIG. 12 is a circuit diagram showing the details of the interruption detecting circuit shown in FIG. 11.

FIG. 12 shows the details of the interruption detecting circuit 31 shown in FIG. 11.

The interruption detecting circuit 31 has flip-flops FF1 and FF2, and logic gates for controlling these flip-flops FF1 and FF2.

The flip-flop FF1 operates in test mode (TESTZ=high level), and sets a refresh window signal REFWZ to high level in synchronization with the rising edge of the refresh timing signal SRTPZ. The flip-flop FF1 resets the refresh window signal REFWZ to low level in synchronization with the falling edge of a start signal STTX or the active signal ACTPX. The start signal STTX is a signal which changes to low level during power-on reset and is then held at high level.

The flip-flop FF2 is set upon receiving the refresh state signal REFZ and the word control signal WTZ of high level while the refresh window signal REFWZ is at high level, or upon receiving the start signal STTX. The interruption detecting signal INTDZ is thereby changed to low level. The flip-flop FF2 is reset in synchronization with the rising edge of the refresh timing signal SRTPZ, and changes the interruption detecting signal INTDZ to high level.

The interruption detecting circuit 31 maintains the interruption detecting signal INTDZ to low level during normal operation mode in which the pseudo SRAM is accessed by the system (TESTZ=low level). In test mode, the interruption detecting circuit 31 changes the interruption detecting signal INTDZ to high level in response to a refresh request, and restores the interruption detecting signal INTDZ to low level when a word line WL is activated in response to this refresh request in the period between the refresh request and the next access request (REFWZ=high level). In other words, the interruption detecting circuit 31 keeps outputting the interruption detecting signal INTDZ of high level when the word line WL corresponding to the refresh request is not activated before the next access request.

Figure 13:
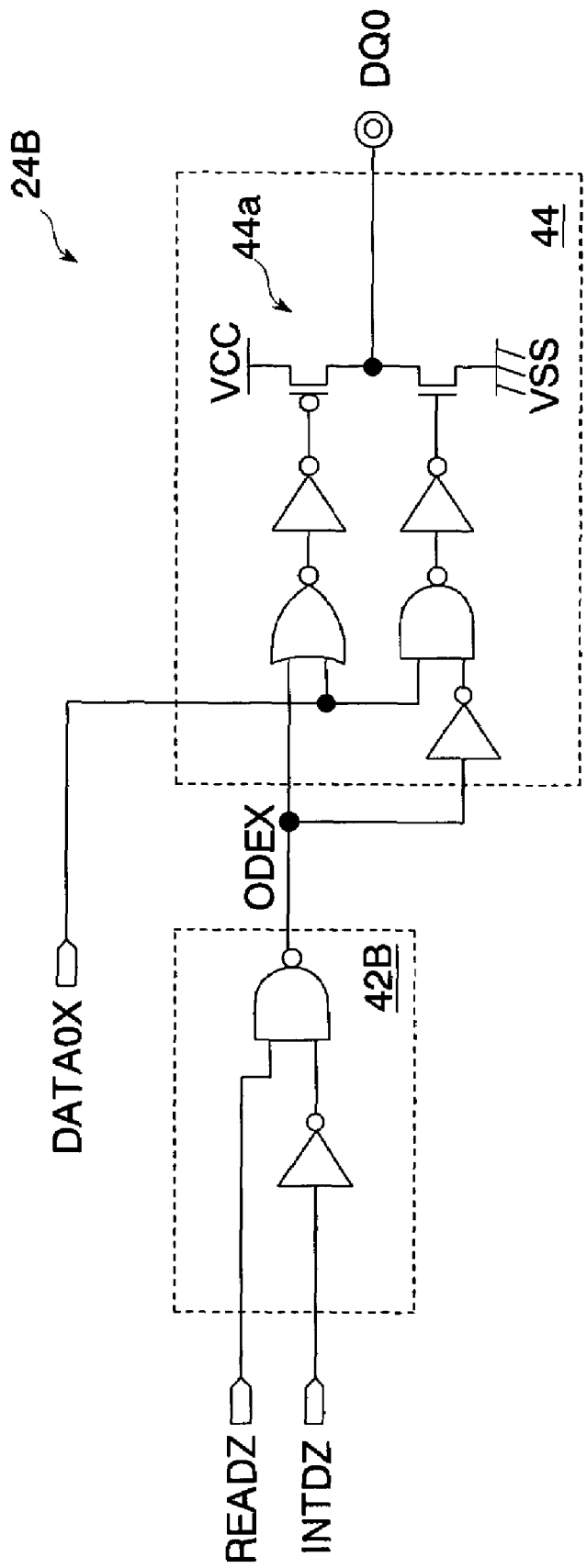
FIG. 13 is a circuit diagram showing the details of the data output circuit shown in FIG. 11.

FIG. 13 shows the details of the data output circuit 24B shown in FIG. 11.

The data output circuit 24B is provided with an output mask circuit 42B instead of the output mask circuit 42 of the data output circuit 24 in the first embodiment (FIG. 3). The rest of the configuration is the same as that of the data output circuit 24. Like FIG. 3, FIG. 13 shows an output buffer circuit 44 that corresponds to the data terminal DQ0. The output mask circuit 42B is a circuit common among the output buffer circuits 44 corresponding to the data terminals DQ0–7.

When the interruption detecting signal INTDZ is at high level, the output mask circuit 42B masks the read timing signal READZ so that the output enable signal ODEX of high level is maintained at high level. That is, the tristate buffer 44a is set to a high impedance state when the interruption detecting signal INTDZ is at high level. When the interruption detecting signal INTDZ is at low level, the output mask circuit 42B inverts the read timing signal READZ and outputs the resultant as the output enable signal ODEX.

Figure 14:
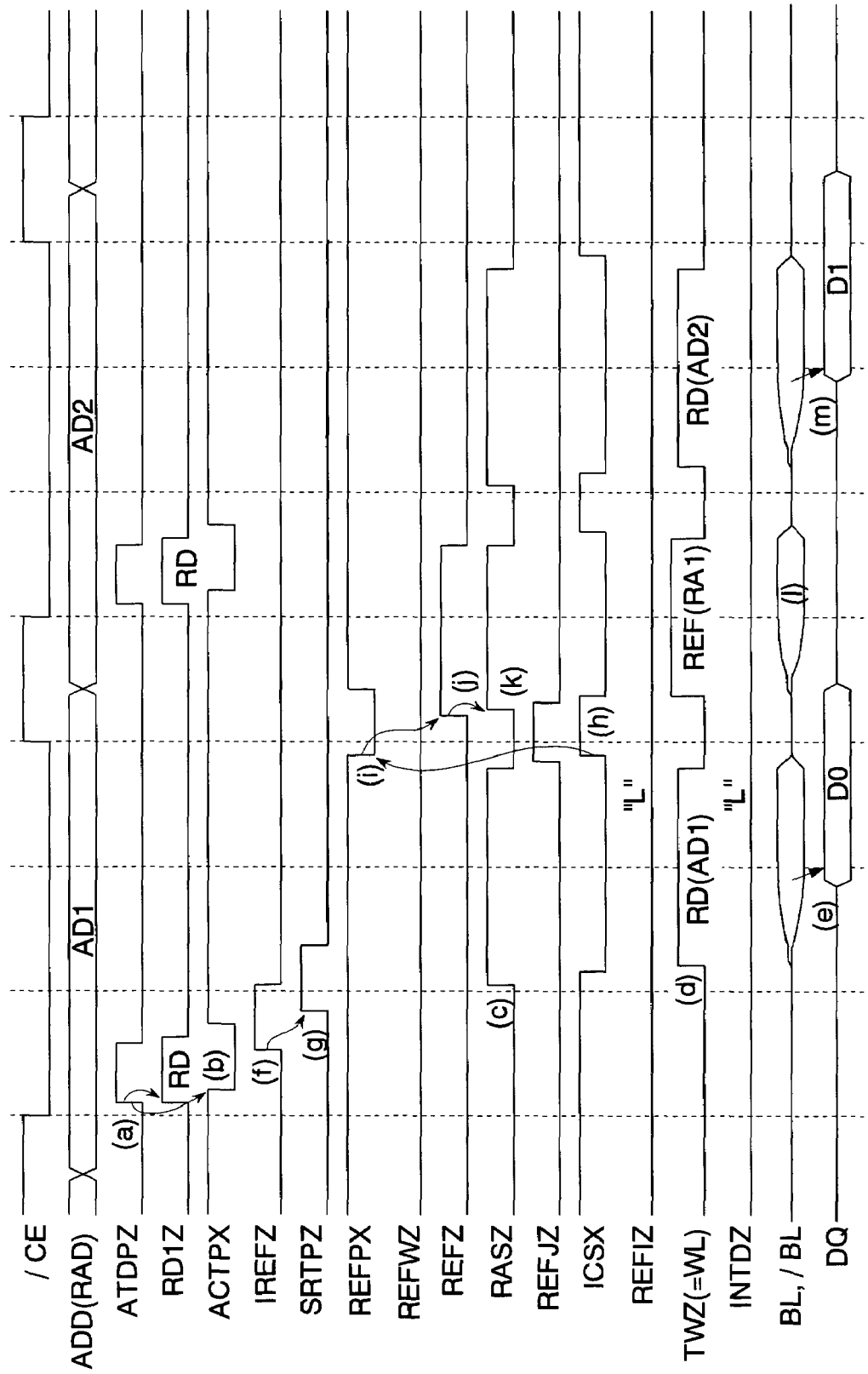
FIG. 14 is a timing chart showing an example of operation of the third embodiment in normal operation mode.
Figure 15:
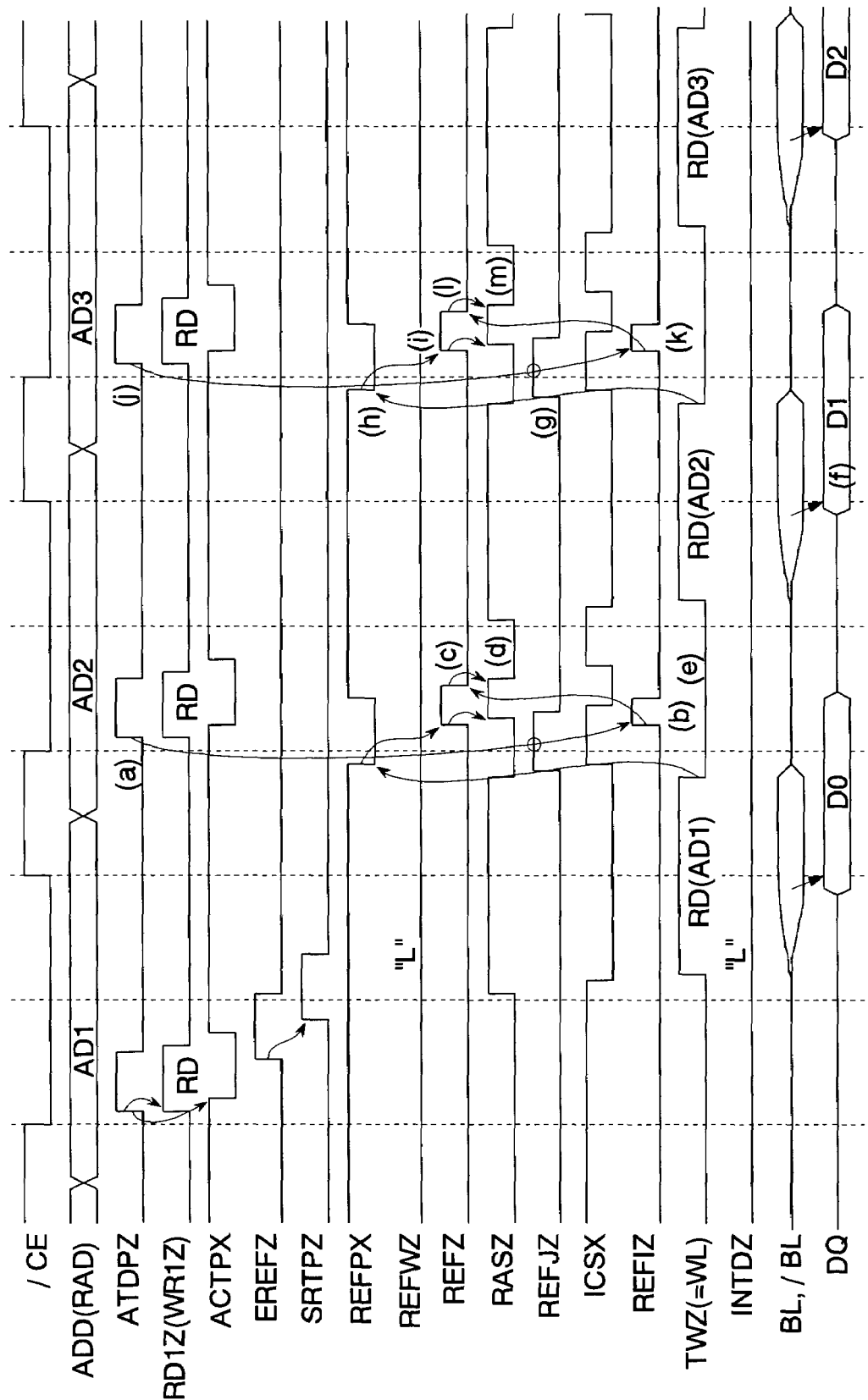
FIG. 15 is a timing chart showing another example of the operation of the third embodiment in normal operation mode.

FIGS. 14 and 15 show examples of operation of the third embodiment in normal operation mode. Description will be omitted of the same operation as in the first embodiment (FIGS. 5 and 7). Here, as is the case with the first embodiment (FIG. 4), write operations WR and read operations RD are performed in an identical cycle time tRC.

FIG. 14 shows an example where a refresh operation can be inserted between successive access operations (read operations).

In this example, two read commands RD are supplied in succession, and the internal refresh request signal IREFZ occurs after the supply of the first read command RD.

Initially, the command control circuit 11 shown in FIG. 11 receives the chip enable signal /CE of low level and the output enable signal /OE of low level, which is not shown, and outputs the access timing signal ATDPZ (FIG. 14(a)). The row operation control circuit 32B receives the access timing signal ATDPZ before the reception of the refresh start signal REFPX, and outputs the read control signal RD1Z and the active signal ACTPX (FIG. 14(b)). The row operation control circuit 32B outputs the row control signal RASZ in response to the access timing signal ATDPZ (FIG. 14(c)). The core control circuit 34B receives the read control signal RD1Z and the row control signal RASZ, and activates the word line control signal TWZ for a predetermined period (FIG. 14(d)). Then, a read operation corresponding to the address AD1 is performed to output read data D0 (FIG. 14(e)).

Meanwhile, immediately after the output of the access timing signal ATDPZ, the internal refresh request IREFZ is output from the refresh timer 16 (FIG. 14(f)). The refresh selecting circuit 14 outputs the refresh timing signal SRTPZ in response to the internal refresh request IREFZ (FIG. 14(g)).

The core control circuit 34B outputs the refresh-interruption judging signal REFJZ for a predetermined period since the completion of the read operation RD (FIG. 14(h)). The arbiter 28B outputs the refresh start signal REFPX in synchronization with the rising edge of the core cycle state signal ICSX that results from the completion of the read operation RD (FIG. 14(i)).

The row operation control circuit 32B outputs the refresh state signal REFZ and the row control signal RASZ in response to the refresh start signal REFPX (FIG. 14(j), (k)). Then, the refresh operation REF corresponding to the internal refresh request IREFZ is performed FIG. 14(l)). Subsequently, a read operation RD corresponding to the address AD2 is performed in response to the next read command RD (FIG. 14(m)).

FIG. 15 shows an example where the refresh operation cannot be performed between the successive access operations (read operations). Detailed description will be omitted of the same operation as in FIG. 14.

In this example, the read commands RD are supplied at intervals shorter than in FIG. 14 seen above. The first read command RD and the refresh request occur with the same timing as in FIG. 14. The same operation as in FIG. 14 takes place from the execution of the read operation corresponding to the address AD1 to the output of the refresh state signal REFZ and the row control signal RASZ for the refresh operation.

The arbiter 28B receives the access control signal ATDPZ corresponding to the next read command RD while the refresh-interruption judging signal REFJZ is at high level (FIG. 15(a)). The arbiter 28B thus outputs the refresh interrupting signal REFIZ (FIG. 15(b)). In response to the refresh interrupting signal REFIZ, the row operation control circuit 32B stops outputting the refresh state signal REFZ and the row control signal RASZ (FIG. 15(c, d)). The core control circuit 34B interrupts the refresh operation under the inactivation of the row control signal RASZ.

The refresh-interruption judging signal REFJZ is output before the word line WL is activated for the refresh operation. Thus, the word line WL is yet to be activated at the time of interruption of the refresh operation. This prevents the data retained in the memory cells from being corrupted due to the interruption of the refresh operation.

Since the refresh operation is interrupted, the word line control signal TWZ for a refresh operation will not be output (FIG. 15(e)). The period where the core cycle state signal ICSX is at low level is short. The arbiter 28B thus determines that the refresh operation is interrupted, and keeps holding the refresh request (SRTPZ). Subsequently, a read operation is performed in response to the second read command RD, and read data D1 is output (FIG. 15(f)).

The core control circuit 34B outputs the refresh-interruption judging signal REFJZ in response to the completion of the second read operation RD (FIG. 15(g)). The arbiter 28B outputs the refresh start signal REFPX in synchronization with the rising edge of the core cycle state signal ICSX that results from the completion of the second read operation RD (FIG. 15(h)). Then, the refresh operation yet to be performed is started again (FIG. 15(i)).

The arbiter 28B receives the access control signal ATDPZ corresponding to the third read command RD while the refresh-interruption judging signal REFJZ is at high level (FIG. 15(j)), and outputs the refresh interrupting signal REFIZ (FIG. 15(k)). In response to the refresh interrupting signal REFIZ, the row operation control circuit 32B stops outputting the refresh state signal REFZ and the row control signal RASZ (FIG. 15(l, m)). The core control circuit 34B interrupts the refresh operation under the inactivation of the row control signal RASZ.

Subsequently, the refresh operation is interrupted each time a read command RD is supplied. Hence, the refresh operation will never be performed. That is, the data retained in the memory cells MC will disappear.

FIGS. 16 to 19 show examples of operation of the third embodiment in test mode. Detailed description will be omitted of the same operation as in FIGS. 14 and 15.

In this example, the pseudo SRAM has already shifted from normal operation mode to test mode. The test mode is used for characteristic evaluation of the pseudo SRAM under development, for example. The characteristic evaluation is effected by connecting the pseudo SRAM of wafer state to probers, and inputting test patterns to the pseudo SRAM from the LSI tester.

In test mode, two or three successive access requests are supplied to determine the minimum possible interval of supply of access requests at which a refresh operation can be inserted between the access operations. Write operations WR and read operations RD are performed in an identical cycle time tRC.

Figure 16:
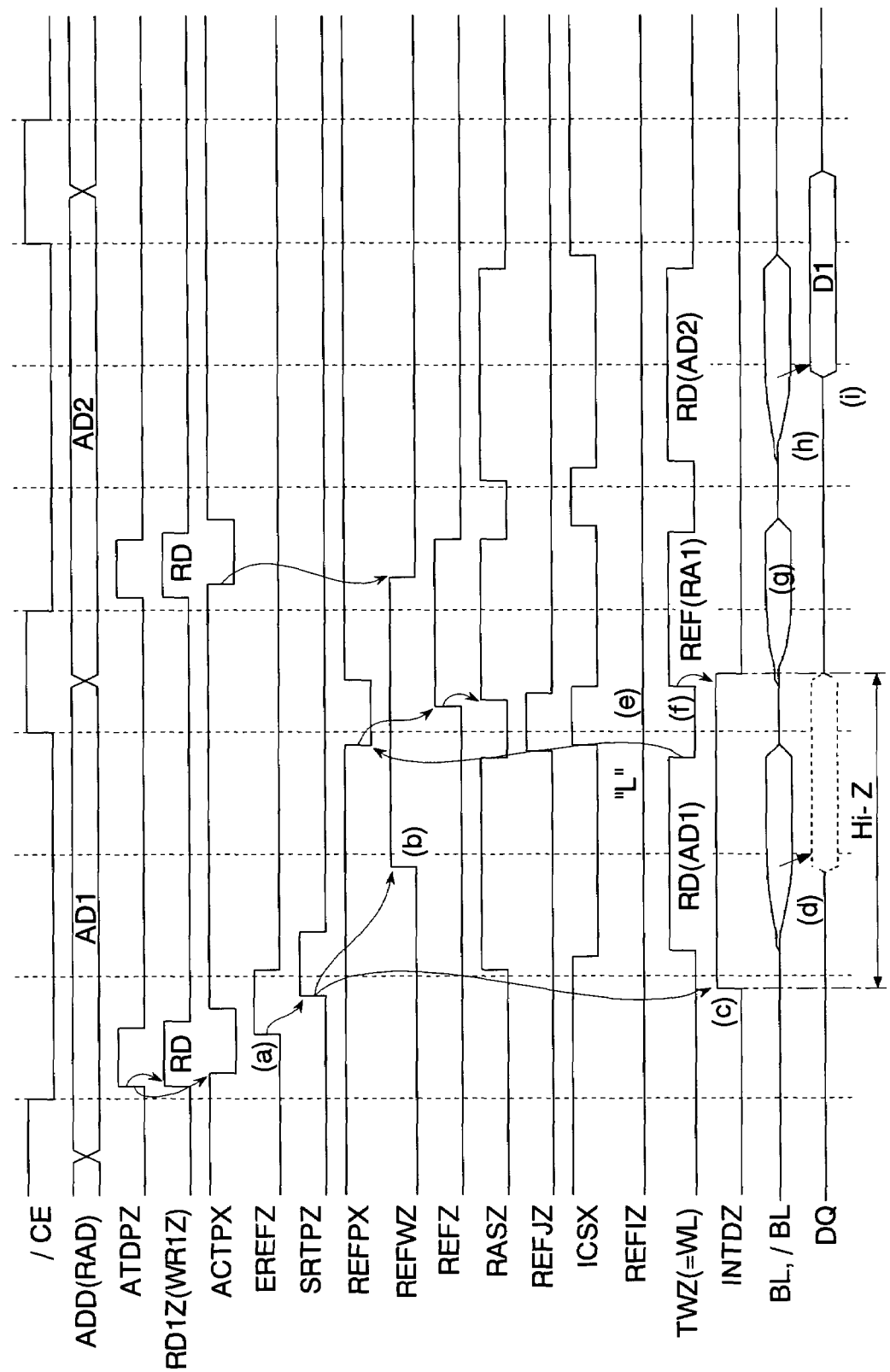
FIG. 16 is a timing chart showing an example of operation of the third embodiment in test mode.

FIG. 16 shows an example where a refresh operation can be performed between successive access operations (read operations).

The read commands and the refresh request occur with the same timing as in FIG. 14. In test mode, however, the refresh selecting circuit 14 shown in FIG. 11 masks the internal refresh request signal IREFZ which is output from the refresh timer 16, receives the test refresh request signal EREFZ which is supplied from the LSI tester through the test terminal SRC instead of the internal refresh request signal IREFZ, and outputs it as the refresh timing signal SRTPZ (FIG. 16(a)). The interruption detecting circuit 31 shown in FIG. 12 maintains the refresh window signal REFWZ at high level during the period between the output of the refresh timing signal SRTPZ and the output of the next active signal ACTPX (FIG. 16(b)).

In test mode, the interruption detecting circuit 31 changes the interruption detecting signal INTDZ to high level in response to the refresh timing signal SRTPZ (FIG. 16(c)). While receiving the interruption detecting signal INTDZ of high level, the data output circuit 24B sets the data terminals DQ0–7 to a high impedance state (FIG. 16(d)). This precludes the read data corresponding to the address AD1 from being output to the data terminals DQ.

In the period between the completion of the read operation and the activation of the word line WL for a refresh operation (while the refresh-interruption judging signal REFJZ is at high level), the next read request corresponding to the address AD2 will not occur. Thus, the refresh interrupting signal REFIZ will not be output, being kept at low level (FIG. 16(e)).

Subsequently, as in FIG. 14 seen above, the core control circuit 34B outputs the word line control signal TWZ in response to the row control signal RASZ (FIG. 16(f)), so that a refresh operation is performed (FIG. 16(g)). Next, the read operation RD corresponding to the address AD2 is performed (FIG. 16(h)).

The interruption detecting signal INTDZ has changed to low level because of the execution of the refresh operation. Consequently, the tristate output buffer 44a of the data output circuit 24B shown in FIG. 13 is activated, and the read data D1 corresponding to the address AD2 is output to the data terminals DQ (FIG. 16(i)).

The LSI tester for testing the pseudo SRAM determines that the refresh operation is inserted between the read operations, since the read data D1 is read properly by the second read operation. That is, the interval of supply of the read commands RD (=read cycle) here is determined as capable of insertion of a refresh operation.

Figure 17:
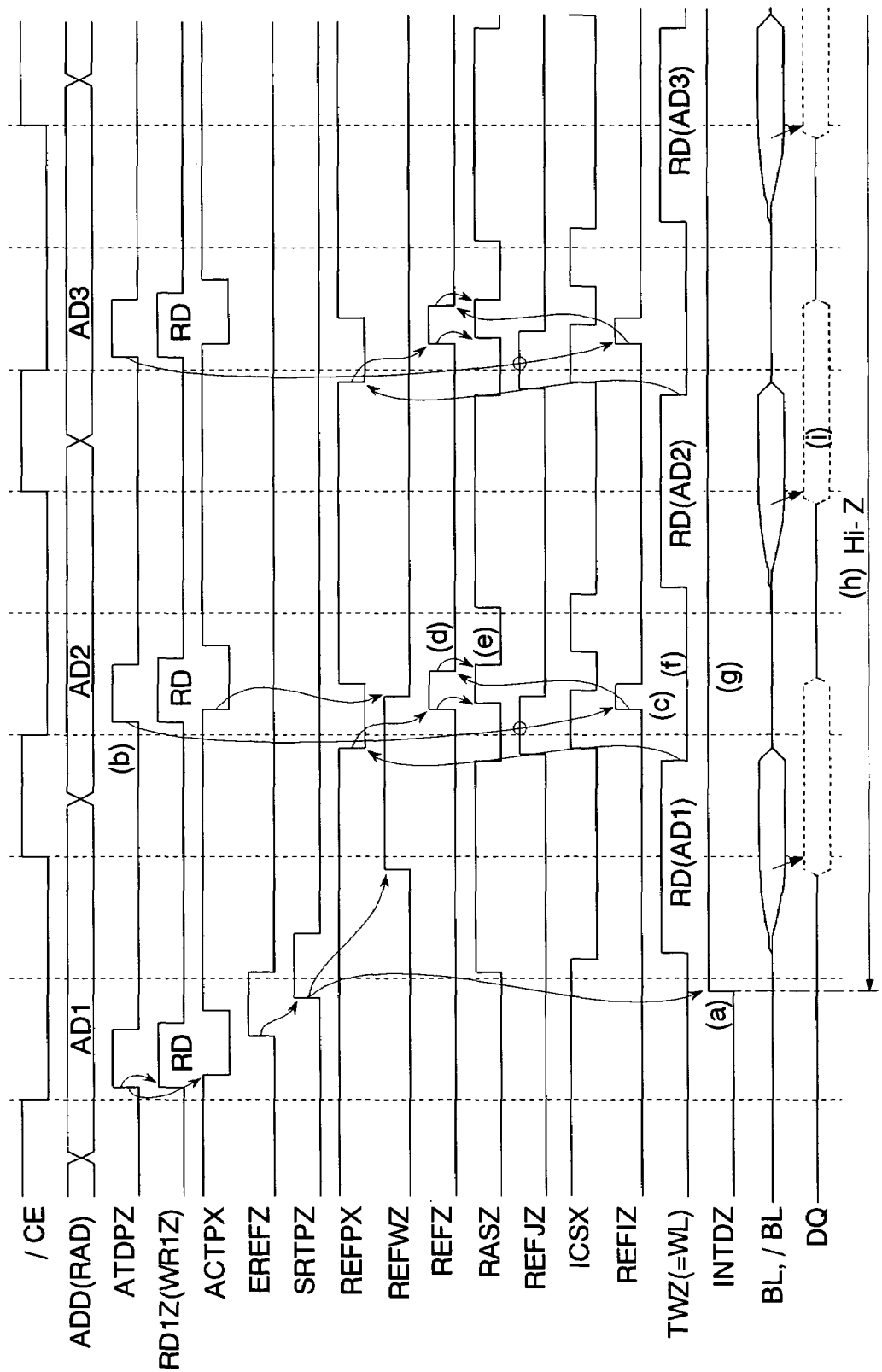
FIG. 17 is a timing chart showing another example of the operation of the third embodiment in test mode.

FIG. 17 shows an example where the refresh operation cannot be performed between the successive access operations (read operations). Detailed description will be omitted of the same operation as in FIG. 16.

In this example, the interval of supply of the read commands RD is set shorter than in FIG. 15 seen above. The first read command RD and the refresh request occur with the same timing as in FIG. 16.

Initially, as in FIG. 16, the interruption detecting circuit 31 changes the interruption detecting signal INTDZ to high level in response to the refresh timing signal SRTPZ (FIG. 17(a)). Subsequently, the same operation as in FIG. 16 takes place from the execution of the read operation corresponding to the address AD1 to the output of the refresh state signal REFZ and the row control signal RASZ for a refresh operation.

The arbiter 28B receives the access control signal ATDPZ corresponding to the next read command RD while the refresh-interruption judging signal REFJZ is at high level (FIG. 17(b)). The arbiter 28B thus outputs the refresh interrupting signal REFIZ (FIG. 17(c)). In response to the refresh interrupting signal REFIZ, the row operation control circuit 32B stops outputting the refresh state signal REFZ and the row control signal RASZ (FIG. 17(d, e)). The core control circuit 34B interrupts the refresh operation under the inactivation of the row control signal RASZ.

Since the refresh operation is interrupted, the word line control signal TWZ for a refresh operation will not be output (FIG. 17(f)). The interruption detecting circuit 31 thus keeps outputting the interruption detecting signal INTDZ of high level (FIG. 17(g)). While receiving the interruption detecting signal INTDZ of high level, the data output circuit 24B sets the data terminals DQ0–7 to a high impedance state (FIG. 17(h)). This precludes the read data corresponding to the address AD2 from being output to the data terminals DQ (FIG. 17(i)).

The LSI tester determines that the refresh operation cannot be inserted between the read operations, since the read data D1 cannot be read by the second read operation. That is, the interval of supply of the read commands RD (=read cycle) here is determined as incapable of insertion of a refresh operation.

Conventionally, whether or not a refresh operation can be inserted has been determined by causing a conflict between an access request and a refresh request and then supplying access requests successively for a long period of time to check for actual disappearance of data. According to the present invention, whether a refresh operation conflicting with an access request is performed or not can be evaluated only in two access cycles.

Incidentally, in actual evaluation using the LSI tester, the interval of supply of read commands RD is reduced gradually in test mode. That is, the test timing is gradually hanged from FIG. 16 to FIG. 17, and the minimum interval of supply with which read data an be read properly at the second cycle is determined as the minimum read cycle.

Figure 18:
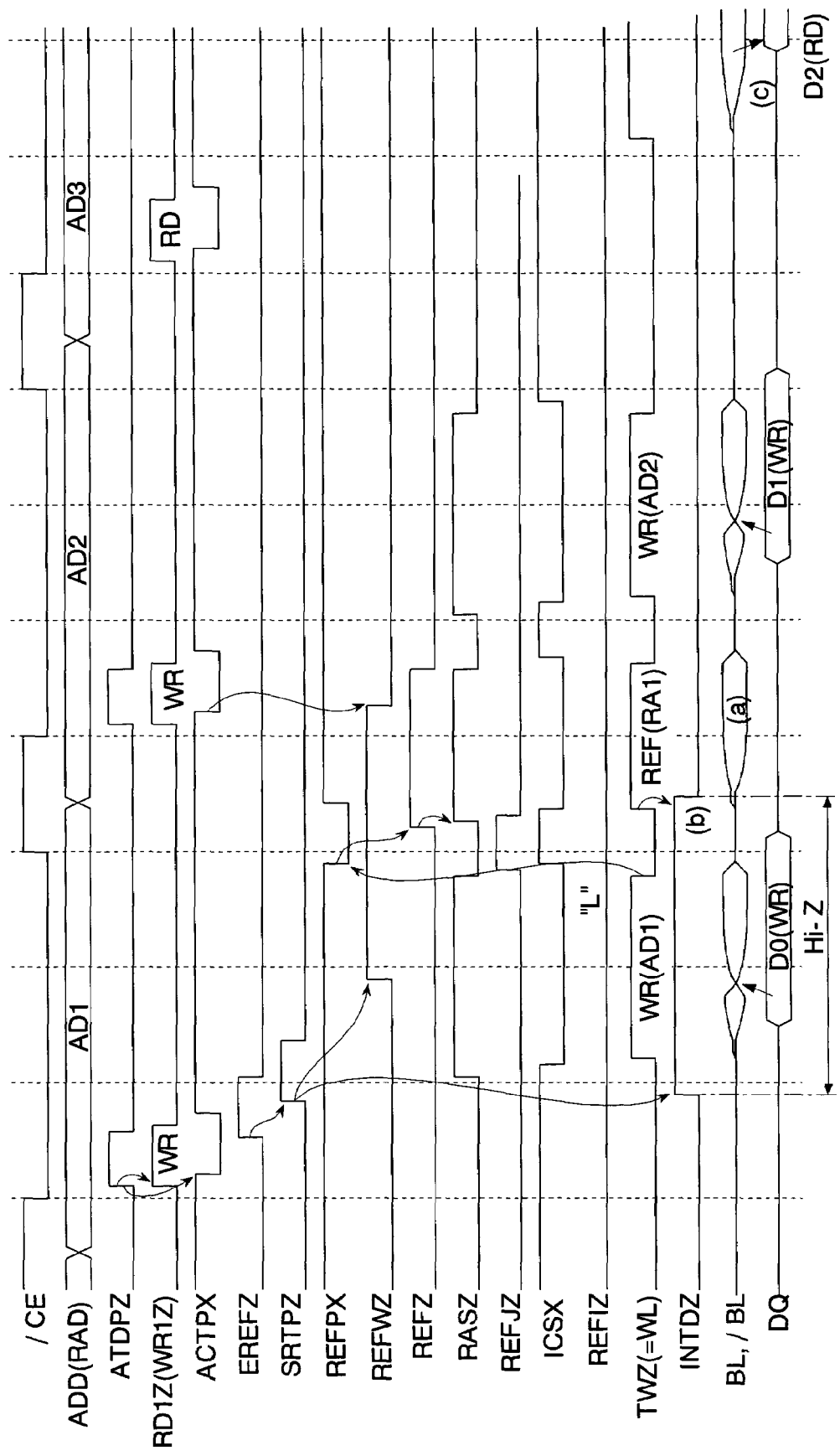
FIG. 18 is a timing chart showing another example of the operation of the third embodiment in test mode.

FIG. 18 shows an example where a refresh operation can be performed between successive access operations (write operations).

The timing of occurrence of the write commands and the refresh request is the same as that of the read commands and the refresh request in FIG. 16. Whether or not a refresh operation can be inserted between write operations is checked, for example, by performing a read cycle after the second write cycle. For this purpose, expected value data is written to the memory cells MC corresponding to the address AD3 in advance.

In this example, the refresh operation is inserted between the write operations (FIG. 18(a)). Then, the interruption detecting signal INTDZ changes to low level (FIG. 18(b)), and the data output circuit 24B makes the same operation as in normal operation mode. The data D2 can thus be read properly from the memory cells MC in the subsequent read operation (FIG. 18(c)).

Figure 19:
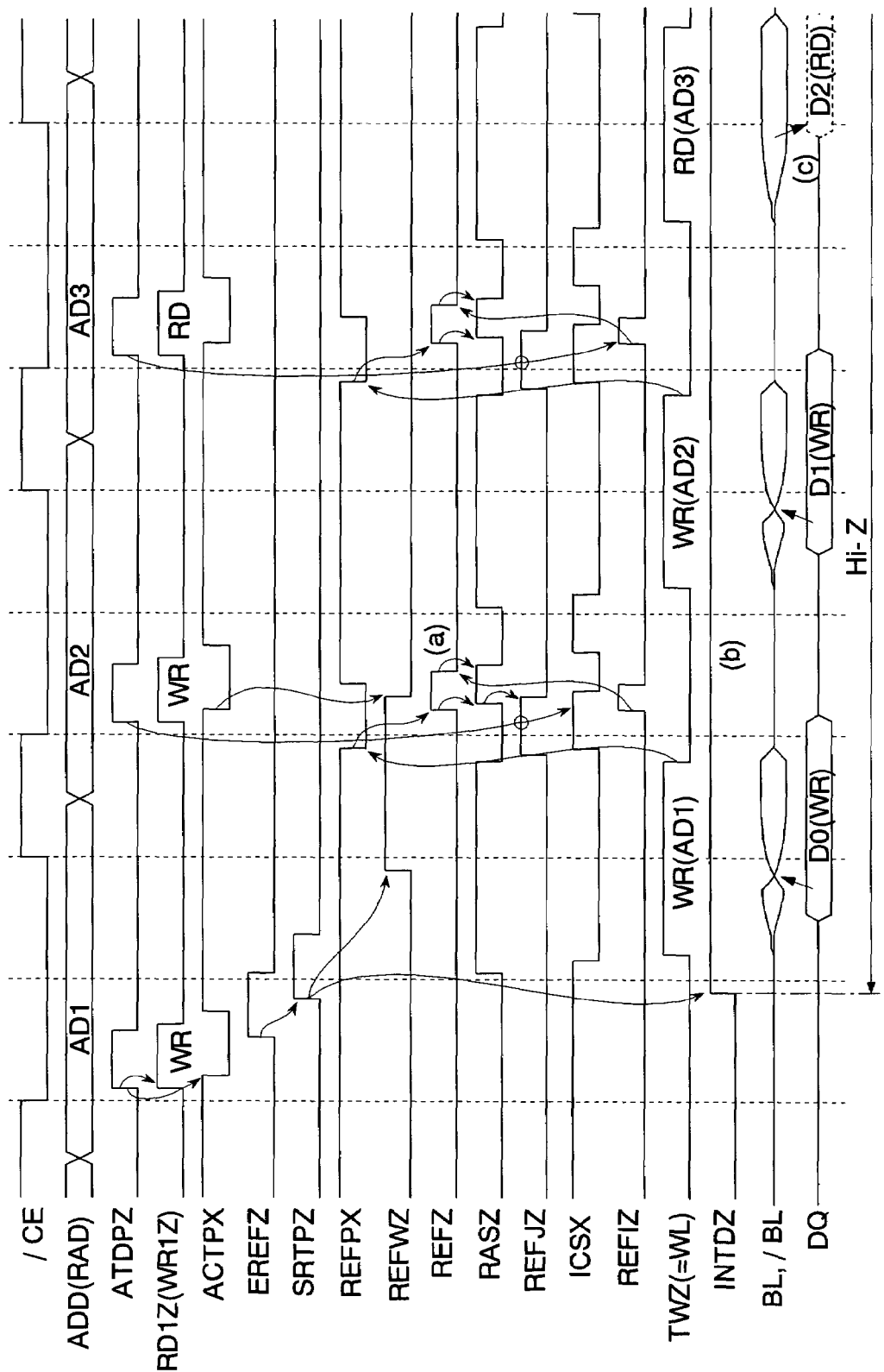
FIG. 19 is a timing chart showing another example of the operation of the third embodiment in test mode.

FIG. 19 shows an example where the refresh operation cannot be performed between the successive access operations (write operations). Detailed description will be omitted of the same operation as in FIGS. 17 and 18.

The timing of occurrence of the write commands and the refresh request is the same as that of the read commands and the refresh request in FIG. 16. In this example, the interval of supply of the write commands WR is set shorter than in FIG. 17 seen above.

Consequently, the refresh operation is interrupted (FIG. 19(a)), and the interruption detecting circuit 31 keeps outputting the interruption detecting signal INTDZ of high level (FIG. 19(b)). As a result, the data output circuit 24B outputs no read data, setting the data terminals DQ to a high impedance state (FIG. 19(c)). The LSI tester determines that the refresh operation cannot be inserted between the write cycles, since the expected value data corresponding to the address AD3 cannot be read.

Incidentally, in actual evaluation using the LSI tester, the interval of supply of write commands WR is reduced gradually in test mode. That is, the test timing is gradually changed from FIG. 18 to FIG. 19, and the minimum interval of supply with which read data can be read property at the third cycle is determined as the minimum write cycle.

As above, the third embodiment can provide the same effects as those of the foregoing first embodiment. Besides, in this embodiment, the pseudo SRAM in which refresh operations are interrupted by subsequent access requests can be evaluated easily and accurately for the minimum possible interval of supply of access commands (minimum access cycle) below which the refresh operations cannot be completed. As a result, the evaluation time can be reduced with a reduction in the development period of the semiconductor memory. That is, the development cost can be cut down. Otherwise, in semiconductor memories under mass production, defects occurring from variations of manufacturing conditions and the like can be analyzed promptly. This can minimize the period of low yield.

Moreover, since the interruption of the refresh operation is judged before the activation of the word line WL, the data in the memory cells MC to be refreshed can be prevented from being corrupted.

The foregoing first and second embodiments have dealt with the cases where the refresh cycle is set shorter than the read cycle and the write cycle. However, the present invention is not limited to such embodiments. The refresh cycle may be set at the same length of time as the read cycle and the write cycle.

The foregoing third embodiment has dealt with the case where evaluation is made as to whether or not a refresh cycle can be inserted between successive read cycles or successive write cycles. However, the present invention is not limited to such an embodiment. For example, the first read cycle shown in FIGS. 15 and 16 can be replaced with a write cycle to evaluate whether or not a refresh cycle can be inserted between successive write and read cycles. Otherwise, the first write cycle shown in FIGS. 17 and 18 can be replaced with a read cycle to evaluate whether or not a refresh cycle can be inserted between successive read and write cycles.

The invention is not limited to the above embodiments and various modifications may be made without departing from the spirit and scope of the invention. Any improvement may be made in part or all of the components.

What is claimed is:

1. A semiconductor memory comprising:
   a memory core having a plurality of memory cells, a bit line connected to said memory cells, and a sense amplifier connected to said bit line;
   a command control circuit for outputting an access request signal for accessing said memory cells in response to an access request supplied through a command terminal;
   a refresh timer for generating an internal refresh request at predetermined cycles;
   an arbiter for determining order of precedence between an access operation corresponding to said access request and a refresh operation corresponding to said internal refresh request when a conflict occurs between said access request and said internal refresh request, and for sequentially outputting a refresh control signal and an access control signal in accordance with the order of precedence;
   an operation control circuit for making said memory core perform an access operation in response to said access control signal, and making said memory core perform a refresh operation in response to said refresh control signal; and
   a detecting circuit for outputting a detection signal indicating that said refresh operation is yet to be performed when a new internal refresh request occurs before said refresh operation corresponding to said internal refresh request is performed, said detecting circuit operating in a test mode.

2. The semiconductor memory according to claim 1, further comprising
   an external terminal for outputting said detection signal to the exterior of the semiconductor memory.

3. The semiconductor memory according to claim 2, further comprising:
   a data terminal that is said external terminal;
   a tristate output buffer for outputting read data from said memory cells to said data terminal; and
   an output mask circuit for controlling said tristate output buffer in said test mode so as to prohibit output of said read data to said data terminal in response to said detection signal and set said data terminal to a high impedance state.

4. The semiconductor memory according to claim 1, further comprising
a refresh selecting circuit for masking said internal refresh request output from said refresh timer and outputting a test refresh request supplied through an external test terminal, instead of said internal refresh request, to said arbiter in said test mode.

5. The semiconductor memory according to claim 1, wherein
said refresh timer receives, in said test mode, a refresh adjustment signal for changing the cycle of generation of said internal refresh request.

6. A semiconductor memory comprising:
a memory core having a plurality of memory cells, a bit line connected to said memory cells, and a sense amplifier connected to said bit line;
a command control circuit for outputting an access request signal for accessing said memory cells in response to an access request supplied through a command terminal;
a refresh timer for generating an internal refresh request at predetermined cycles;
an arbiter for determining order of precedence between an access operation corresponding to said access request and a refresh operation corresponding to said internal refresh request when a conflict occurs between said access request and said internal refresh request;
an interruption circuit for outputting a refresh interrupting signal upon receiving a next access request within a predetermined period from the completion of said access operation performed with precedence over said refresh operation;
an operation control circuit for starting a refresh operation of said memory core when said arbiter determines to give precedence to said internal refresh request, interrupting said refresh operation in execution upon receiving said refresh interrupting signal, and making said memory core perform an access operation when said arbiter determines to give precedence to said access request; and
an interruption detecting circuit for operating in a test mode and outputting a detecting signal when a refresh operation is interrupted in response to said refresh interrupting signal.

7. The semiconductor memory according to claim 6, further comprising
an external terminal for outputting said detection signal to the exterior of the semiconductor memory.

8. The semiconductor memory according to claim 7, further comprising:
a data terminal that is said external terminal;
a tristate output buffer for outputting read data from said memory cells to said data terminal; and
an output mask circuit for controlling said tristate output buffer in said test mode so as to prohibit output of said read data to said data terminal in response to said detection signal and set said data terminal to a high impedance state.

9. The semiconductor memory according to claim 6, further comprising
a refresh selecting circuit for masking said internal refresh request output from said refresh timer and outputting a test refresh request supplied through an external test terminal, instead of said internal refresh request, to said arbiter in said test mode.

10. The semiconductor memory according to claim 6, further comprising
a word line connected to said memory cells, and wherein
said predetermined period is a period from when said operation control circuit receives an instruction to start a refresh operation from said arbiter until when activation of said word line is started for the refresh operation.

* * * * *